US011984356B2

(12) United States Patent
Lim et al.

(10) Patent No.: US 11,984,356 B2
(45) Date of Patent: May 14, 2024

(54) CONTACT STRUCTURES IN SEMICONDUCTOR DEVICES

(71) Applicant: Taiwan Semiconductor Manufacturing Co., Ltd., Hsinchu (TW)

(72) Inventors: Peng-Soon Lim, Johor (MY); Chung-Liang Cheng, Changhua County (TW); Huang-Lin Chao, Hillsboro, OR (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 149 days.

(21) Appl. No.: 17/519,242

(22) Filed: Nov. 4, 2021

(65) Prior Publication Data

US 2022/0254684 A1     Aug. 11, 2022

Related U.S. Application Data

(60) Provisional application No. 63/148,197, filed on Feb. 11, 2021.

(51) Int. Cl.
*H01L 21/768*     (2006.01)
*H01L 21/8234*    (2006.01)
(Continued)

(52) U.S. Cl.
CPC .. *H01L 21/76871* (2013.01); *H01L 21/76804* (2013.01); *H01L 21/76865* (2013.01);
(Continued)

(58) Field of Classification Search
CPC ............ H01L 21/768; H01L 21/76804; H01L 21/76871; H01L 21/76865;
(Continued)

(56) References Cited

U.S. PATENT DOCUMENTS 9,105,490 B2   8/2015 Wang et al.
9,236,267 B2   1/2016 De et al.
(Continued)

FOREIGN PATENT DOCUMENTS

TW        202101546 A    1/2021

*Primary Examiner* — Chuong A Luu
(74) *Attorney, Agent, or Firm* — Sterne, Kessler, Goldstein & Fox P.L.L.C.

(57) ABSTRACT

A semiconductor device with liner-free contact structures and a method of fabricating the same are disclosed. The method includes forming first and second source/drain (S/D) regions on first and second fin structures, forming a first dielectric layer between the first and second S/D regions, forming first and second gate-all-around (GAA) structures on the first and second fin structures, forming a second dielectric layer on the first and second GAA structures and the first dielectric layer, forming a tapered trench opening in the second dielectric layer and on the first and second GAA structures and the first dielectric layer, selectively forming a seed layer on top surfaces of the first and second GAA structures and the first dielectric layer that are exposed in the tapered trench opening, and selectively depositing a conductive layer on the seed layer to fill the tapered trench opening.

20 Claims, 37 Drawing Sheets

(51) Int. Cl.
*H01L 23/522* (2006.01)
*H01L 27/088* (2006.01)

(52) U.S. Cl.
CPC .. *H01L 21/823475* (2013.01); *H01L 23/5226* (2013.01); *H01L 27/088* (2013.01); *H01L 21/76843* (2013.01); *H01L 21/823412* (2013.01); *H01L 21/823456* (2013.01)

(58) Field of Classification Search
CPC ......... H01L 21/76879; H01L 21/76876; H01L 21/76895; H01L 21/76843; H01L 21/8234; H01L 21/823412; H01L 21/823431; H01L 21/823456; H01L 21/823475; H01L 23/522; H01L 23/485; H01L 23/5226; H01L 27/088; H01L 29/06; H01L 29/0673; H01L 29/423; H01L 29/42392; H01L 29/66; H01L 29/66439; H01L 29/775; H01L 29/786; H01L 29/78696; H01L 29/49; H01L 29/4908; H01L 29/0607; H01L 27/092; H01L 21/8238; H01L 21/823807

USPC .................................. 438/279, 283
See application file for complete search history.

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,903,350 B2 | 1/2021 | Chou |
| 2019/0109043 A1 | 4/2019 | Wang et al. |
| 2020/0035787 A1* | 1/2020 | Wang ............... H01L 21/76897 |
| 2020/0135858 A1 | 4/2020 | Chiu et al. |

* cited by examiner

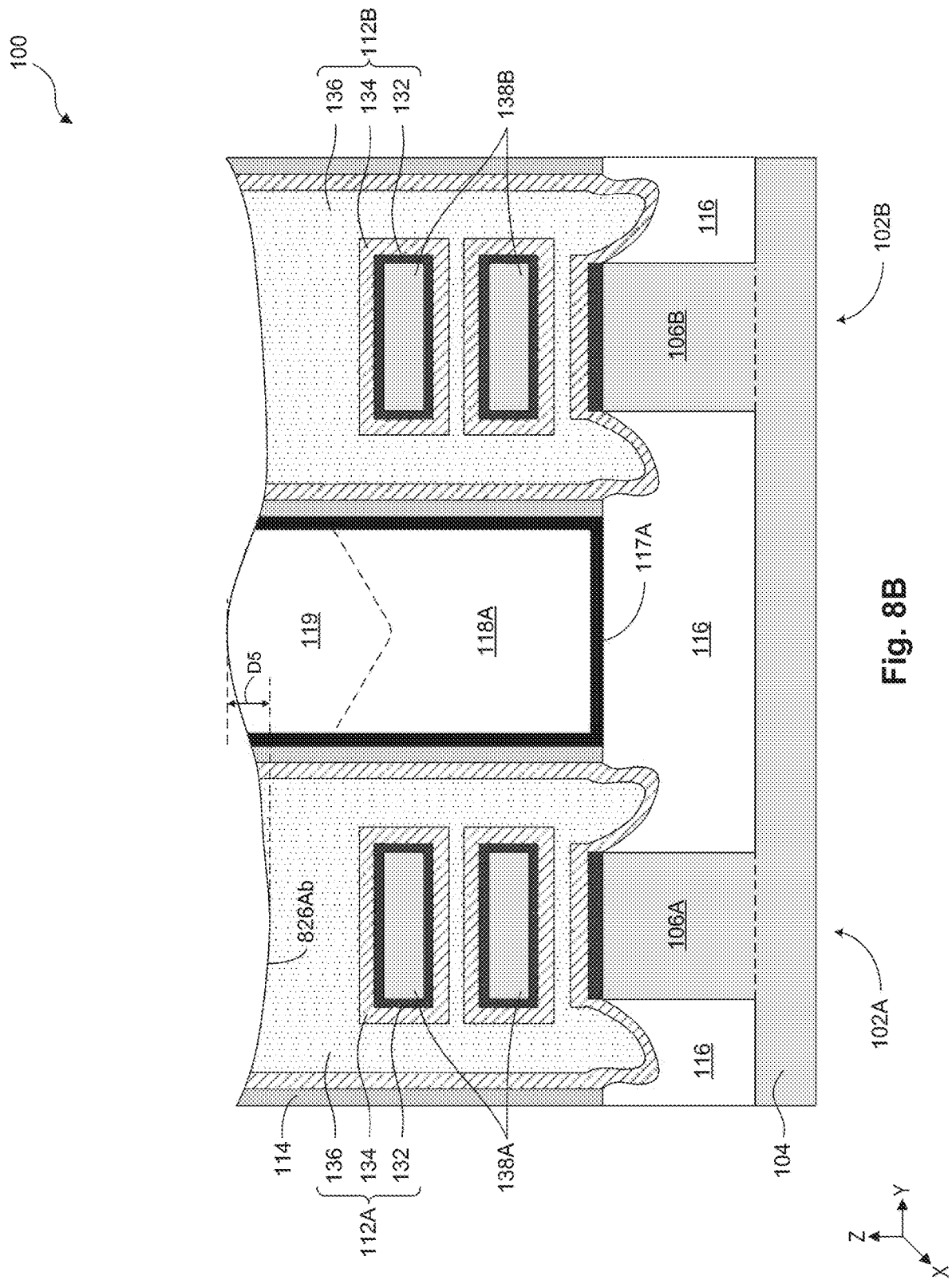

CONTACT STRUCTURES IN SEMICONDUCTOR DEVICES

CROSS-REFERENCE TO RELATED APPLICATIONS

This application claims the benefit of U.S. Provisional Patent Application No. 63/148,197, titled "Seamless Metal Fill Process for Trenches and Vias" and filed Feb. 11, 2021, the disclosure of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and gate-all-around FETs (GAA FETs). Such scaling down has increased the complexity of semiconductor manufacturing processes.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1A:
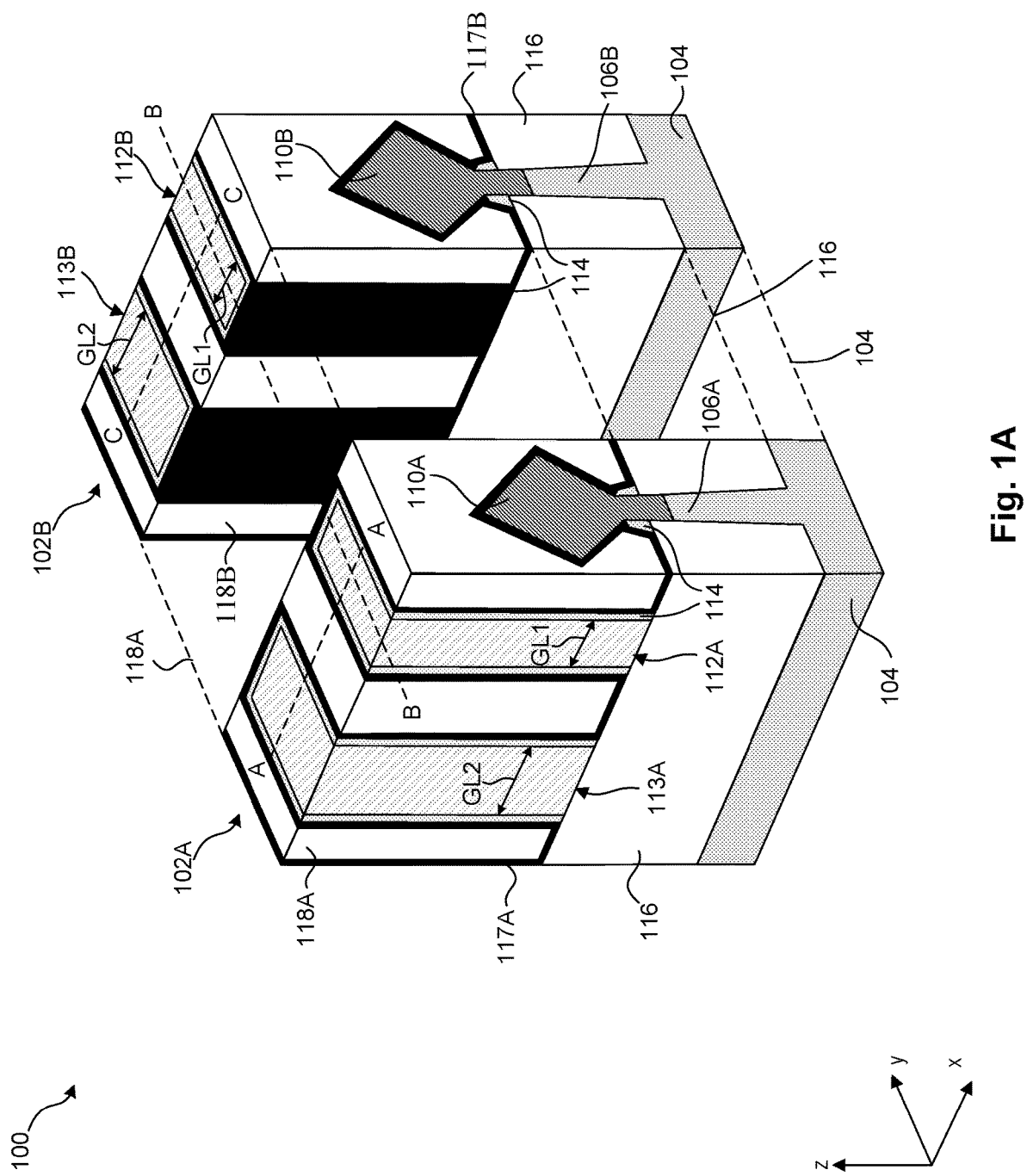
FIG. 1A illustrates an isometric view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides an example method for addressing challenges with forming a continuous liner-free contact structure and/or metal line across conductive structures separated by insulating structures. The challenges can be due to the lower deposition selectivity of conductive materials for insulating surfaces than for conductive surfaces, which can prevent a substantially uniform deposition of the conductive materials across the conductive structures and the insulating structures. The term "deposition selectivity" refers to the ratio of the deposition rates on two different materials or surfaces under the same deposition conditions. As a result of the non-uniform deposition of the conductive materials, a discontinuous liner-free contact structure and/or metal line can be formed across the conductive structures, which can degrade the electrical connection between the conductive structures.

In some embodiments, the example method includes forming a liner-free contact structure extending along the top surfaces of gate structures of different FETs (e.g., finFETs, GAA FETs, or MOSFETs) and the top surfaces of insulating structures disposed between the gate structures. In some embodiments, the example method can further include a process to "cut" the liner-free contact structure into shorter sections to form individual contact structures on each of the gate structures. In other words, the process can remove portions of the liner-free contact structure between the gate structures (e.g., portions of the liner-free contact structure on the insulating structures) to form one or more isolation trenches (also referred to as "metal-cuts") that can electrically isolate the remaining portions of the liner-free contact structure from each other. This method of forming individual contact structures by cutting a long contact structure can reduce the fabrication process complexities of forming contact structures with smaller dimensions. Moreover, this method can reduce structural and/or compositional non-uniformities among contact structures of different FETs of a semiconductor device, and consequently improve device performance.

In some embodiments, the example method can include forming a contact opening along the top surfaces of gate structures of different FETs and the top surfaces of insulating structures disposed between the gate structures, forming a seed layer on the top surfaces of the gate and insulating structures within the contact opening, and selectively depositing a conductive material on the seed layer. Similar methods can be used to form liner-free metal lines along the top surfaces of underlying vias and/or metal lines of an interconnect structure and the top surfaces of insulating structures disposed between the vias and/or metal lines.

Figure 1B:
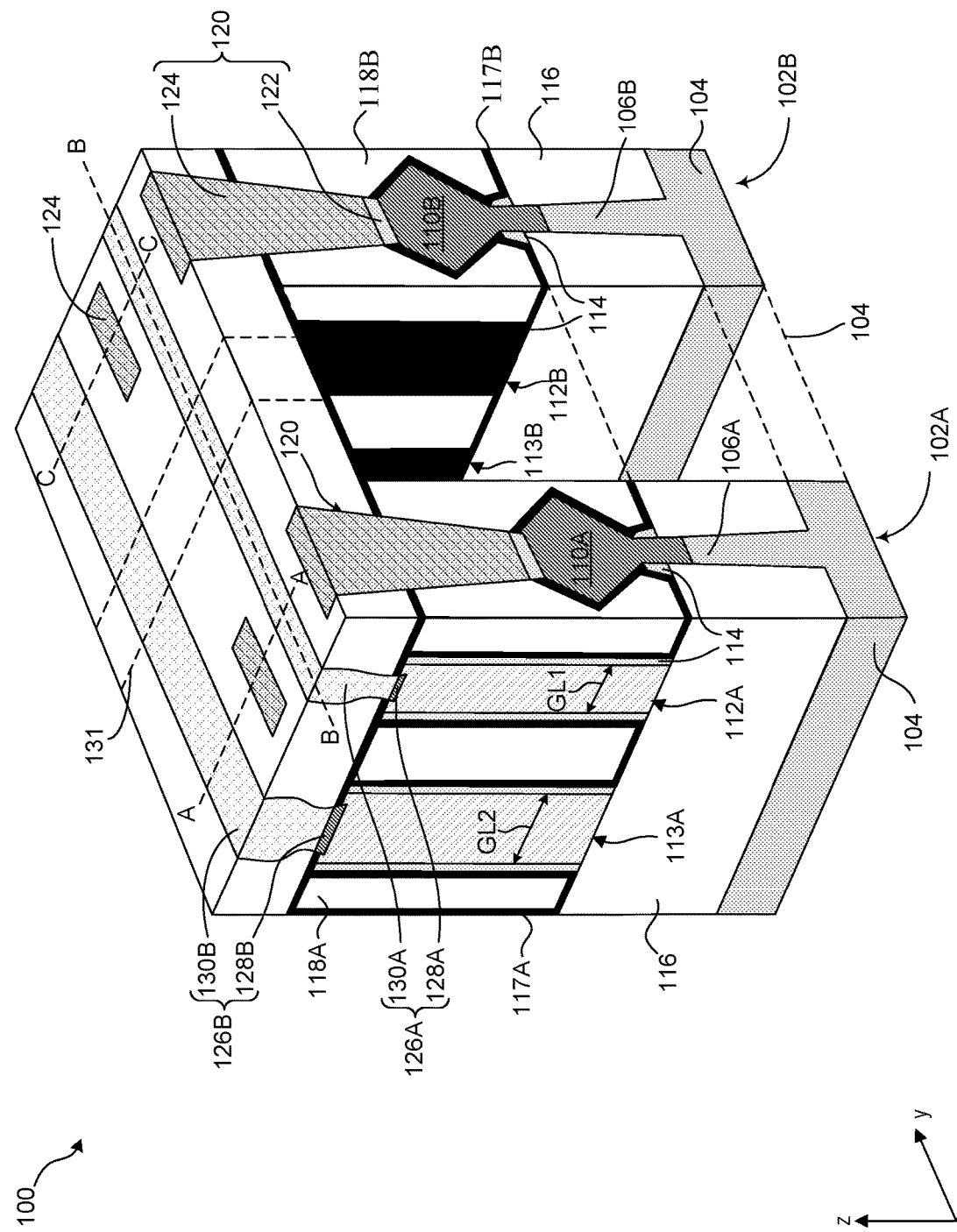
FIG. 1B illustrates an isometric view of a semiconductor device with contact structures, in accordance with some embodiments.
Figure 1C:
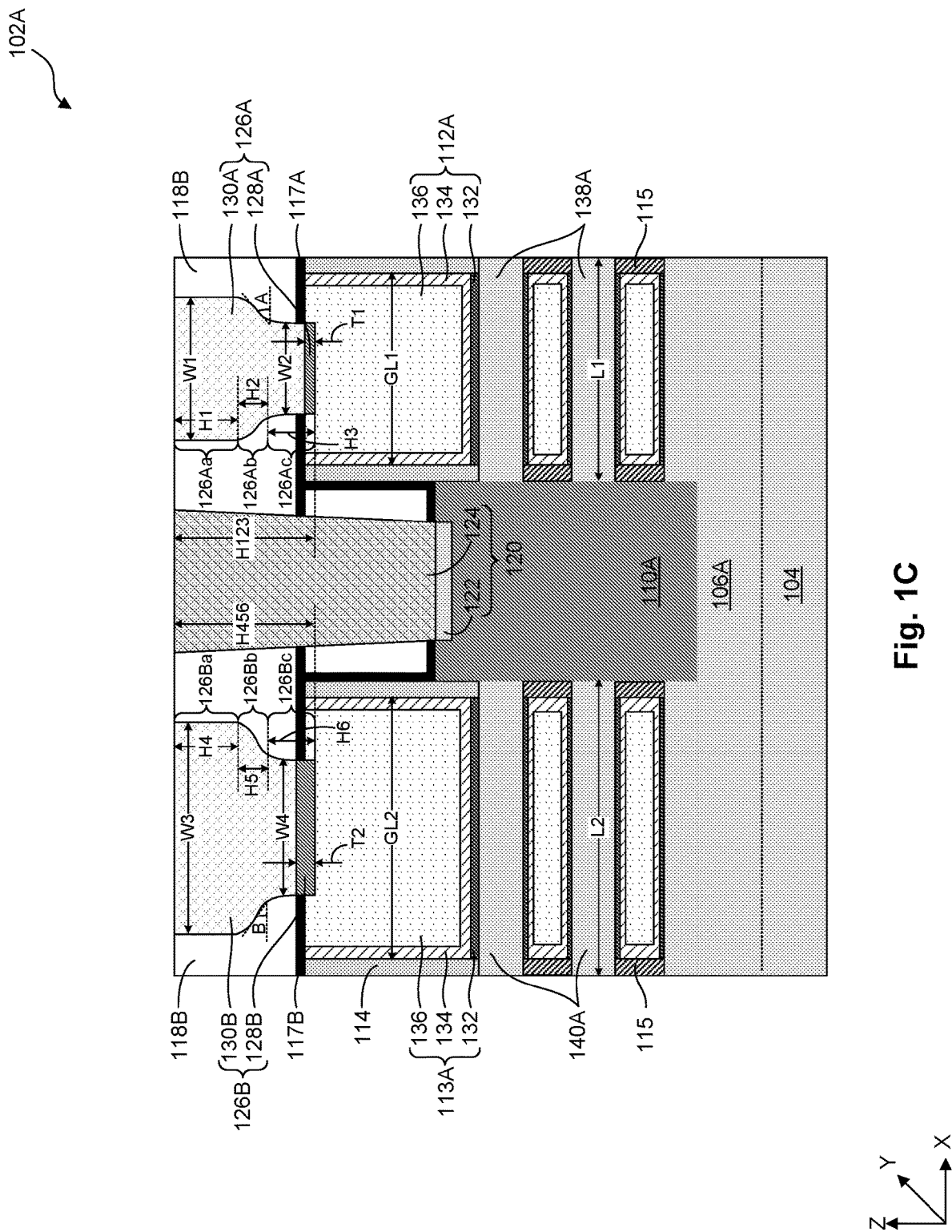
FIGS. 1C-1E illustrate cross-sectional views of a semiconductor device with contact structures, in accordance with some embodiments.
Figure 1D:
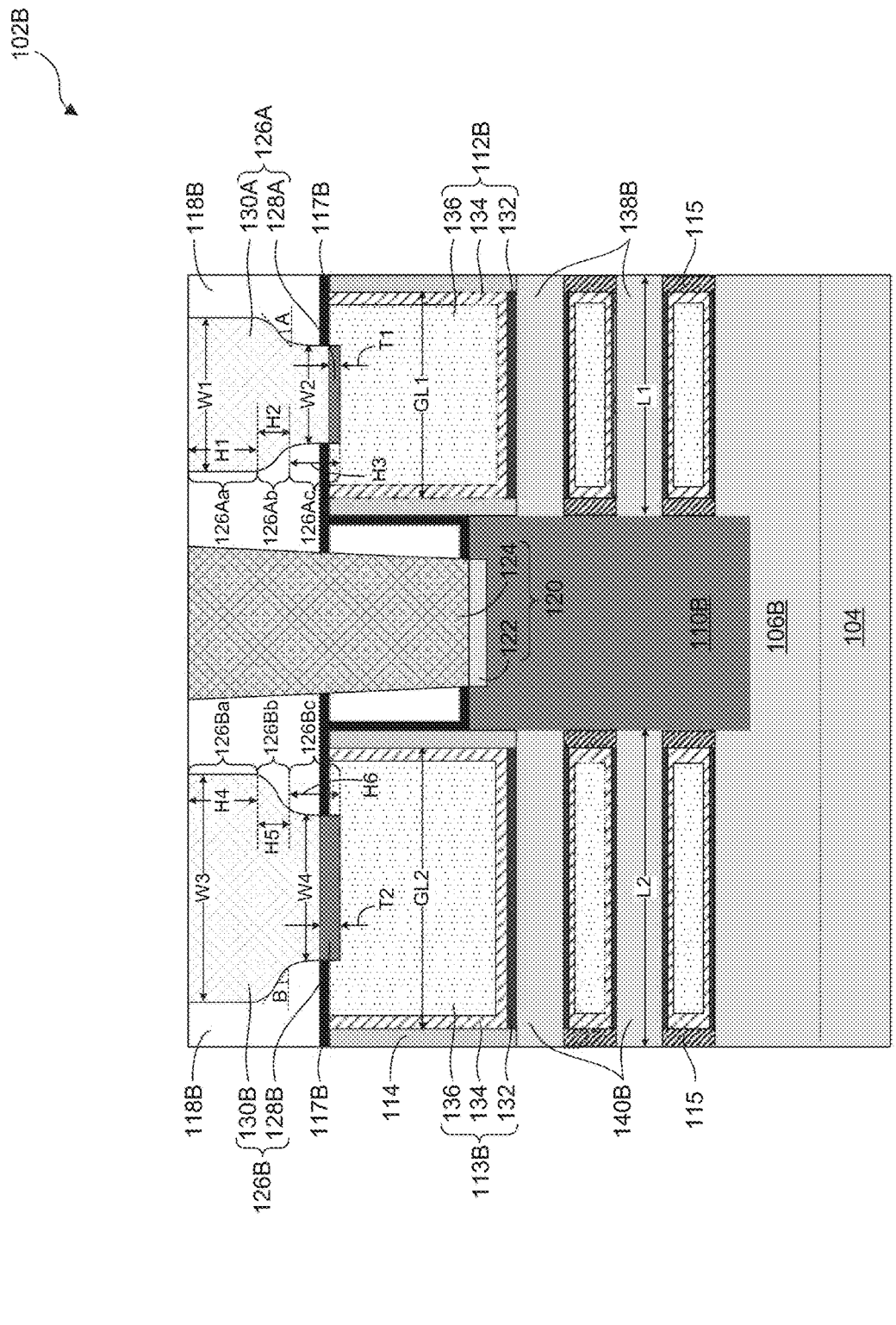
Figure 1E:
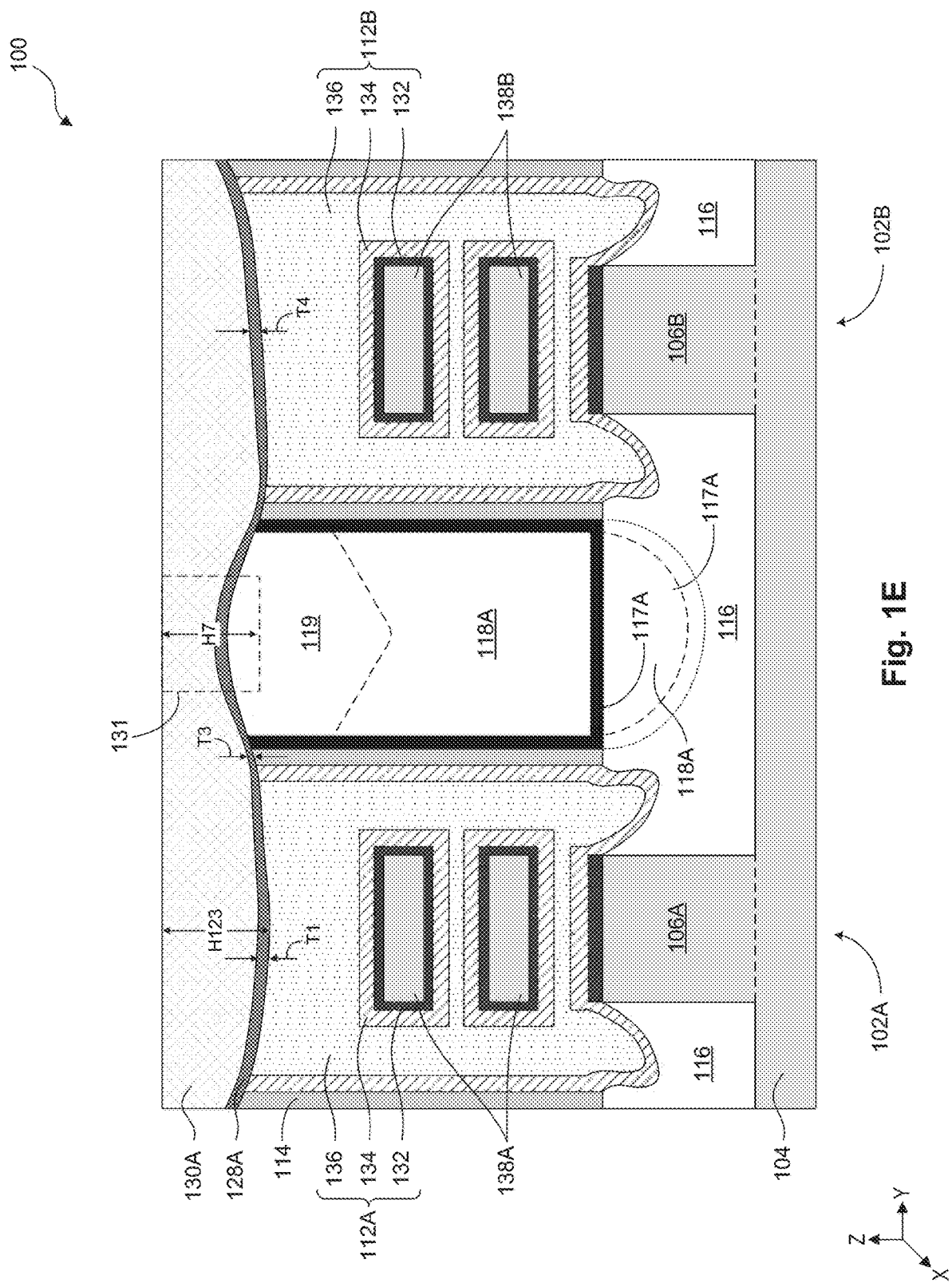

FIG. 1A illustrates an isometric view of a semiconductor device 100 with FETs 102A-102B, according to some embodiments. Though semiconductor device 100 is shown to have two FETs 102A-102B, semiconductor device 100 can have any number of FETs. In some embodiments, FETs 102A-102B can represent n-type FETs 102A-102B (NFETs 102A-102B) or p-type FETs 102A-102B (PFETs 102A-102B). The discussion of FETs 102A-102B applies to both NFETs 102A-102B and PFETs 102A-102B, unless mentioned otherwise. FIG. 1B illustrates an isometric view of semiconductor device 100 with contact structures 120 and 126A-126B, according to some embodiments. FIGS. 1C-1E illustrate cross-sectional views of semiconductor device 100 along lines A-A, C-C, and B-B of FIGS. 1A-1B. FIGS. 1C-1E illustrate cross-sectional views of semiconductor device 100 with additional structures that are not shown in FIGS. 1A-1B for simplicity. The discussion of elements of FETs 102A-102B with the same annotations applies to each other, unless mentioned otherwise.

Referring to FIGS. 1A-1E, semiconductor device 100 can include (i) a substrate 104, (ii) fin structures 106A-106B on the substrate 104, (iii) gate structures 112A-113A disposed on fin structure 106A on the substrate 104, (iv) gate structures 112B-113B disposed on fin structure 106B on the substrate 104, (v) source/drain (S/D) regions 110A-110B disposed on portions of fin structures 106A-106B that are not covered by gate structures 112A-113A and 112B-113B, (vi) S/D contact structures 120 disposed on S/D regions 110A-110B, (vii) gate contact structure 126A disposed on gate structures 112A-112B, and (viii) gate contact structure 126B disposed on gate structures 113A-113B. The discussion of gate structures 112A-113A applies to gate structures 112B-113B, respectively, unless mentioned otherwise. Semiconductor device 100 can further include (i) gate spacers 114, (ii) shallow trench isolation (STI) regions 116, (iii) etch stop layers (ESLs) 117A-117B, and (iv) interlayer dielectric (ILD) layers 118A-118B. Portions of ILD layer 118A, STI region 116, and substrate 104 between FETs 102A and 102B are not shown in FIGS. 1A-1B for simplicity. In some embodiments, gate spacers 114, STI regions 116, ESLs 117A-117B, and ILD layers 118A-118B can include an insulating material, such as silicon oxide, silicon nitride (SiN), silicon carbon nitride (SiCN), silicon oxycarbon nitride (SiOCN), silicon germanium oxide, and other suitable insulating materials.

Semiconductor device 100 can be formed on substrate 104. There may be other FETs and/or structures (e.g., isolation structures) formed on substrate 104. Substrate 104 can be a semiconductor material, such as silicon, germanium (Ge), silicon germanium (SiGe), a silicon-on-insulator (SOI) structure, other suitable semiconductor materials, and a combination thereof. Further, substrate 104 can be doped with p-type dopants (e.g., boron, indium, aluminum, or gallium) or n-type dopants (e.g., phosphorus or arsenic). In some embodiments, fin structures 106A-106B can include a material similar to substrate 104 and extend along an Z-axis.

Referring to FIGS. 1C and 1E, FET 102A can include (i) a stack of nanostructured channel regions 138A surrounded by gate structure 112A and disposed on fin structure 106A, (ii) a stack of nanostructured channel regions 140A surrounded by gate structure 113A disposed on fin structure 106A, and (iii) an epitaxial S/D region 110A disposed between the stacks of nanostructured channel regions 138A and 140A. The term "nanostructured" refers to a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm are within the scope of the disclosure. Similarly, referring to FIGS. 1D-1E, FET 102B can include (i) a stack of nanostructured channel regions 138B surrounded by gate structure 112B and disposed on fin structure 106B, (ii) a stack of nanostructured channel regions 140B surrounded by gate structure 113B disposed on fin structure 106B, and (iii) an epitaxial S/D region 110B disposed between the stacks of nanostructured channel regions 138B and 140B. The discussion of nanostructured channel regions 138A-140A applies to nanostructured channel regions 138B-140B, respectively, unless mentioned otherwise. In some embodiments, FETs 102A-102B can be finFETs and can have fin regions (not shown) instead of nanostructured channel regions 138A-140A and 138B-140B. Such finFETs 102A-102B can have gate structures 112A-113A and 112B-113B disposed on the fin regions.

Referring to FIGS. 1C and 1E, nanostructured channel regions 138A-140A can include semiconductor materials similar to or different from substrate 104 and can include semiconductor material similar to or different from each other. In some embodiments, nanostructured channel regions 138A-140A can include Si, silicon arsenic (SiAs), silicon phosphide (SiP), silicon carbide (SiC), silicon carbon phosphide (SiCP), SiGe, silicon germanium boron (SiGeB), germanium boron (GeB), silicon germanium stannum boron (SiGeSnB), a III-V semiconductor compound, or other suitable semiconductor materials. Though two nanostructured channel regions are shown in each stack, FETs 102A-102B can include any number of nanostructured channel regions in each stack. Though rectangular cross-sections of nanostructured channel regions 138A-140A are shown, nanostructured channel regions 138A-140A can have cross-sections of other geometric shapes (e.g., circular, elliptical, triangular, or polygonal). In some embodiments, nanostructured channel region 138A can have a length L1 that is shorter than length L2 of nanostructured channel regions 140A due to the different configurations of gate structures 112A and 113A, which are described in detail below. In some embodiments, a ratio (L1:L2) between lengths L1 and L2 can range from about 1:2 to about 1:5 to achieve gate performance characteristics of gate structures 112A and 113A that are distinct from each other.

For NFETs 102A-102B, S/D regions 110A-110B can include an epitaxially-grown semiconductor material, such as Si, and n-type dopants, such as phosphorus and other suitable n-type dopants. For PFETs 102A-102B, S/D regions 110A-110B can include an epitaxially-grown semiconductor material, such as Si and SiGe, and p-type dopants, such as boron and other suitable p-type dopants.

Gate structures 112A and 113A can be multi-layered structures and can surround nanostructured channel regions 138A and 140A, for which gate structures 112A-112B can be referred to as "gate-all-around (GAA) structures" or "horizontal gate-all-around (HGAA) structures." FET 102A can be referred to as "GAA FET 102A." Gate portions of gate structures 112A and 113A surrounding nanostructured channel regions 138A and 140A can be electrically isolated from adjacent S/D region 110A by inner spacers 115, as shown in FIG. 1C. Gate portions of gate structures 112A and 113A disposed on the stacks of nanostructured channel regions 138A and 140A can be electrically isolated from adjacent S/D region 110A by gate spacers 114, as shown in FIG. 1C. Inner spacers 115 and gate spacers 114 can include an insulating material, such as $SiO_2$, SiN, SiCN, SiOCN, and other suitable insulating materials.

In some embodiments, gate structure 112A can have a length GL1 that is shorter than gate length GL2 of gate structure 113A and a ratio (GL1:GL2) between lengths GL1 and GL2 can range from about 1:2 to about 1:5 to achieve gate performance characteristics of gate structures 112A and 113A that are distinct from each other. In some embodiments, gate length GL1 can be less than about 30 nm (e.g., about 25 nm, about 20 nm, about 10 nm, and about 5 nm) and gate length GL2 can be greater than about 30 nm (e.g., about 35 nm, about 50 nm, about 60 nm, and about 70 nm). Each of gate structures 112A and 113A can include an interfacial oxide (IO) layer 132, a high-k (HK) gate dielectric layer 134 disposed on IO layer 132, and a conductive layer 136 disposed on HK gate dielectric layer 134. As used herein, the term "high-k (HK)" refers to a high dielectric constant. In the field of semiconductor device structures and manufacturing processes, HK refers to a dielectric constant that is greater than the dielectric constant of $SiO_2$ (e.g., greater than 3.9).

IO layers 132 can include silicon oxide ($SiO_2$), silicon germanium oxide ($SiGeO_x$, or germanium oxide ($GeO_x$). HK gate dielectric layers 134 can include a high-k dielectric material, such as hafnium oxide ($HfO_2$), titanium oxide ($TiO_2$), hafnium zirconium oxide ($HfZ_rO$), tantalum oxide ($Ta_2O_3$), hafnium silicate ($HfSiO_4$), zirconium oxide ($Z_rO_2$), and zirconium silicate ($Z_rSiO_2$). Conductive layers 136 can be multi-layered structures. The different layers of conductive layers 136 are not shown for simplicity. Each of conductive layers 136 can include a WFM layer disposed on HK dielectric layer 134, and a gate metal fill layer on the WFM layer. In some embodiments, the WFM layers can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based materials, or a combination thereof. In some embodiments, the WFM layers can include substantially Al-free (e.g., with no Al) Ti-based or Ta-based nitrides or alloys, such as titanium nitride (TiN), titanium silicon nitride (TiSiN), titanium gold (Ti-Au) alloy, titanium copper (Ti-Cu) alloy, tantalum nitride (TaN), tantalum silicon nitride (TaSiN), tantalum gold (Ta-Au) alloy, tantalum copper (Ta-Cu) alloy, and a combination thereof. The gate metal fill layers can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

In some embodiments, each of S/D contact structures 120 can include (i) a silicide layer 122 disposed within each of S/D regions 110A-110B, and (ii) a contact plug 124 disposed on silicide layer 122. In some embodiments, for NFETs 102A-102B, silicide layers 122 can include a metal or a metal silicide with a work function value closer to a conduction band-edge energy than a valence band-edge energy of the material of S/D regions 110A-110B. For example, the metal or the metal silicide can have a work function value less than 4.5 eV (e.g., about 3.5 eV to about 4.4 eV), which can be closer to the conduction band energy (e.g., 4.1 eV for Si) than the valence band energy (e.g., 5.2 eV for Si) of Si-based material of S/D regions 110A-110B. In some embodiments, for NFETs 102A-102B, the metal silicide of silicide layers 122 can include titanium silicide ($Ti_xSi_y$), tantalum silicide ($Ta_xSi_y$), molybdenum silicide ($Mo_xSi_y$), zirconium silicide ($Zr_xSi_y$), hafnium silicide ($Hf_xSi_y$), scandium silicide ($Sc_xSi_y$), yttrium silicide ($Yb_xSi_y$), terbium silicide ($Tb_xSi_y$), lutetium silicide ($Lu_xSi_y$), erbium silicide ($Er_xSi_y$), ybtterbium silicide ($Yb_xSi_y$), europium silicide ($Eu_xSi_y$), thorium silicide ($Th_xSi_y$), other suitable metal silicide materials, or a combination thereof.

In some embodiments, for PFETs 102A-102B, silicide layers 122 can include a metal or a metal silicide with a work function value closer to a valence band-edge energy than a conduction band-edge energy of the material of S/D regions 110A-110B. For example, the metal or the metal silicide can have a work function value greater than about 4.5 eV (e.g., about 4.5 eV to about 5.5 eV), which can be closer to the valence band energy (e.g., about 5.2 eV for Si) than the conduction band energy (e.g., about 4.1 eV for Si) of Si-based material of S/D regions 110A-110B. In some embodiments, for PFETs 102A-102B, the metal silicide of silicide layers 122 can include nickel silicide ($Ni_xSi_y$), cobalt silicide ($Co_xSi_y$), manganese silicide ($Mn_xSi_y$), tungsten silicide ($W_xSi_y$), iron silicide ($Fe_xSi_y$), rhodium silicide ($Rh_xSi_y$), palladium silicide ($Pd_xSi_y$), ruthenium silicide ($Ru_xSi_y$), platinum silicide ($Pt_xSi_y$), iridium silicide ($Ir_xSi_y$), osmium silicide ($Os_xSi_y$), other suitable metal silicide materials, or a combination thereof.

Contact plugs 124 can include conductive materials with low resistivity (e.g., resistivity about 50 μΩ-cm, about 40 μΩ-cm, about 30 μΩ-cm, about 20 μΩ-cm, or about 10 μΩ-cm), such as cobalt (Co), tungsten (W), ruthenium (Ru), iridium (Ir), nickel (Ni), Osmium (Os), rhodium (Rh), aluminum (Al), molybdenum (Mo), other suitable conductive materials with low resistivity, and a combination thereof.

Referring to FIGS. 1B-1E, gate contact structure 126A can extend along a Y-axis and can be disposed on gate structures 112A-112B and the portion of ILD layer 118A disposed between gate structures 112A-112B. Gate contact structure 126B can extend along a Y-axis and can be disposed on gate structures 113A-113B and the portion of ILD layer 118A disposed between gate structures 113A-113B. To optimize the contact areas between gate contact structures 126A-126B and gate structures 112A-112B and 113A-113B for desired device performance, gate contact structure 126B can be formed with greater widths (e.g., widths W3, W4) on gate structures 113A-113B with longer gate lengths GL2 than widths (e.g., widths W1, W2) of gate contact structure 126A, which is formed on gate structures 112A-112B with shorter gate lengths GL1. In some embodiments, for contact area optimization between gate contact structure 126A and gate structures 112A-112B, a ratio (W2:GL1) between width W2 of gate contact structure 126A and gate length GL1 can range from about 1:3 to about 1:6. Similarly, for contact area optimization between gate contact structure 126B and gate structures 113A-113B, a ratio (W4:GL2) between width W4 of gate contact structure 126B and gate length GL2 can range from about 1:3 to about 1:6.

Gate contact structures 126A-126B can include seed layers 128A-128B and conductive layers 130A-130B disposed on seed layers 128A-128B. Gate contact structures 126A-126B do not have liners along sidewalls of seed layers 128A-128B and/or along sidewalls of conductive layers 130A-130B, and thus, gate contact structures 126A-126B can be referred to as liner-free contact structures 126A-126B. Seed layers 128A-128B provide surfaces favorable for the selective deposition of conductive layers 130A-130B, which is described in detail below. Without the use of seed layer 128A, conductive layer 130A may be formed as a discontinuous layer across gate structures 112A-112B, unlike the continuous layer shown in FIG. 1E. The discontinuity may be due to the lower deposition selectivity of the conductive material of conductive layer 130A for the insulating surface of ILD layer 118A than for the conductive surface of gate structures 112A-112B. Such difference in the deposition selectivities can prevent a substantially uniform deposition of the conductive materials across gate structures 112A-112B and the portion of ILD layer 118A disposed between gate structures 112A-112B. Similarly, without the use of seed layer 128B, conductive layer 130B may be formed as a discontinuous layer across gate structures 113A-113B.

In some embodiments, each of seed layers 128A-128B can include a conductive material, such as a metal and a metal nitride. In some embodiments, the metal can include Ti, Ta, W, Ru, Co, other suitable metals, or a combination thereof. In some embodiments, the metal nitride can include titanium nitride (TiN), tantalum nitride (TaN), tungsten nitride (WN), other suitable metal nitride, or a combination thereof. In some embodiments, seed layers 128A-128B can include conductive materials similar to or different from each other. In some embodiments, each of conductive layers 130A-130B can include a conductive material, such as W, Co, Ru, Cu, Al, other suitable conductive material, and a combination thereof. In some embodiments, conductive layers 130A-130B can include conductive materials similar to or different from each other.

Gate contact structure 126A can have a tapered shape with a wider top portion 126Aa, a narrower bottom portion 126Ac, and a transition portion 126Ab (also referred to as "shoulder portion 126Ab") between top and bottom portions 126Aa and 126Ac. The wider top portion 126Aa compared to the bottom portion 126Ac can prevent the formation of voids within conductive layer 130A during the selective deposition of conductive layer 130A, which is described in detail below. The sidewalls of top and bottom portions 126Aa and 126Ac can be substantially vertical and the sidewalls of transition portion 126Ab can be curved or sloped. The top portion 126Aa can have a height H1 ranging from about 30 nm to about 40 nm, the bottom portion 126Ac can have a height H3 ranging from about 10 nm to about 30 nm, and the transition portion 126Ab can have a height H2 ranging from about 5 nm to about 10 nm. The ratio (H3:H1) between heights H3 and H1 can range from about 1:1 to about 1:2. The total height H123 of gate contact structure 126A can range from about 50 nm to about 80 nm.

The top portion 126Aa can have a width W1 less than about 20 nm (e.g., ranging from about 10 nm to about 15 nm) and the bottom portion 126Ac can have a width W2 less than about 15 nm (e.g., ranging from about 2 nm to about 10 nm). The ratio (W2:W1) between widths W2 and W1 can range from about 1:1.5 to about 1:3. The ratio (W1:GL1) between width W1 and gate length GL1 can range from about 1:1.5 to about 1:3, and the ratio (W2:GL1) between width W2 and gate length GL1 can range from about 1:3 to about 1:6. The aspect ratio (H123:W1) of gate contact structure 126A between height H123 and width W1 can range from about 5:1 to about 10:1. The aforementioned dimension ranges and ratios of gate contact structure 126A can prevent the formation of voids within conductive layer 130A during the selective deposition of conductive layer 130A in addition to providing an optimized contact area between gate contact structure 126A and gate structures 112A-112B.

In some embodiments, the sidewalls of transition portion 126Ab can form angles A with an X-axis and angles A range between about 45 degrees and 90 degrees to minimize the deposition of materials along the sidewalls and to facilitate the etching of the deposited materials along the sidewalls during the formation of seed layer 128A, which is described in detail below. In some embodiments, for adequately depositing conductive layer 130A on seed layer 128A, seed layer 128A can have a thickness T1 ranging from about 2 nm to about 4 nm, which can be dependent on width W2. The ratio (T1:W2) between thickness T1 and width W2 can range from about 1:1 to about 1:5. In some embodiments, thickness of seed layer 128A can vary along a Y-axis, as shown in FIG. 1E. For example, as shown in FIG. 1E, seed layer 128A can have different thicknesses T1, T3, and T4 along a Y-axis on gate structure 112A, gate spacer 114, and gate structure 112B, respectively. Similarly, thickness of conductive layer 130A can vary along a Y-axis, as shown in FIG. 1E, due to the non-coplanarity between the top surfaces of gate structures 112A-112B, gate spacers 114, ESL 117A, and ILD layer 118A. The non-coplanarity of these top surfaces can be a result of an etching process during the formation of gate contact structure 126A, which is described in detail below.

Similar to gate contact structure 126A, gate contact structure 126B can have a tapered shape with a wider top portion 126Ba, a narrower bottom portion 126Bc, and a transition portion 126Bb (also referred to as "shoulder portion 126Bb") between top and bottom portions 126Ba and 126Bc. The sidewalls of top and bottom portions 126Ba and 126Bc can be substantially vertical and the sidewalls of transition portion 126Bb can be curved or sloped. The discussion of heights H1, H2, H3, and H123 applies to respective heights H4, H5, H6, and H456 of gate contact structure 126B, unless mentioned otherwise. The top portion 126Ba can have a width W3 greater than about 20 nm (e.g., ranging from about 30 nm to about 50 nm) and the bottom portion 126Bc can have a width W4 greater than about 20 nm (e.g., ranging from about 25 nm to about 40 nm). The ratio (W4:W3) between widths W4 and W3 can range from about 1:1.5 to about 1:3. The ratio (W3:GL2) between width W3 and gate length GL2 can range from about 1:1.5 to about 1:3, and the ratio (W4:GL2) between width W4 and gate length GL2 can range from about 1:3 to about 1:6. The aspect ratio (H456:W3) of gate contact structure 126B between height H456 and width W3 can range from about 5:1 to about 10:1. The aforementioned dimension ranges and ratios of gate contact structure 126B can prevent the formation of voids within conductive layer 130B during the selective deposition of conductive layer 130B in addition to providing an optimized contact area between gate contact structure 126B and gate structures 113A-113B.

In some embodiments, the sidewalls of transition portion 126Bb can form angles B with an X-axis and angles B range between about 45 degrees and 90 degrees to minimize the deposition of materials along the sidewalls and to facilitate the etching of the deposited materials along the sidewalls during the formation of seed layer 128B, which is described in detail below. In some embodiments, for adequately depositing conductive layer 130B on seed layer 128B, seed layer 128B can have a thickness T2 ranging from about 4 nm to about 6 nm, which can be dependent on width W4. The ratio (T2:W4) between thickness T2 and width W4 can range from about 1:5 to about 1:10. In some embodiments, a ratio (T1:T2) between thicknesses T1 and T2 can range from about 1:2 to about 1:3.

Referring to FIGS. 1B and 1E, in some embodiments, semiconductor device 100 can include an isolation structure 131 (also referred to as "metal-cut 131") on ILD layer 118A to cut gate contact structures 126A-126B into shorter sections that are electrically isolated from each other. Isolation structure 131 can include a dielectric material, such as an oxide material, a nitride material, and a combination thereof. In some embodiments, isolation structure 131 can have a height H7 that is substantially equal to or greater than heights H123 and H456 of gate contact structures 126A and 126B. The ratio (H123:H7) between heights H123 and H7 can range from about 1:1 to about 1:2 for electrical isolation between the shorter sections of gate contact structure 126A.

In some embodiments, referring to FIG. 1E, semiconductor device 100 can include dielectric regions 119 on ILD layer 118A. The material of dielectric regions 119 can be different from the material of ILD layer 118A and can have a higher density than that of the material of LD layer 118A. In some embodiments, referring to FIG. 1E, ILD layer 118A and ESL 117A can extend below gate structures 112A-112B as shown with dashed lines.

Figure 2:
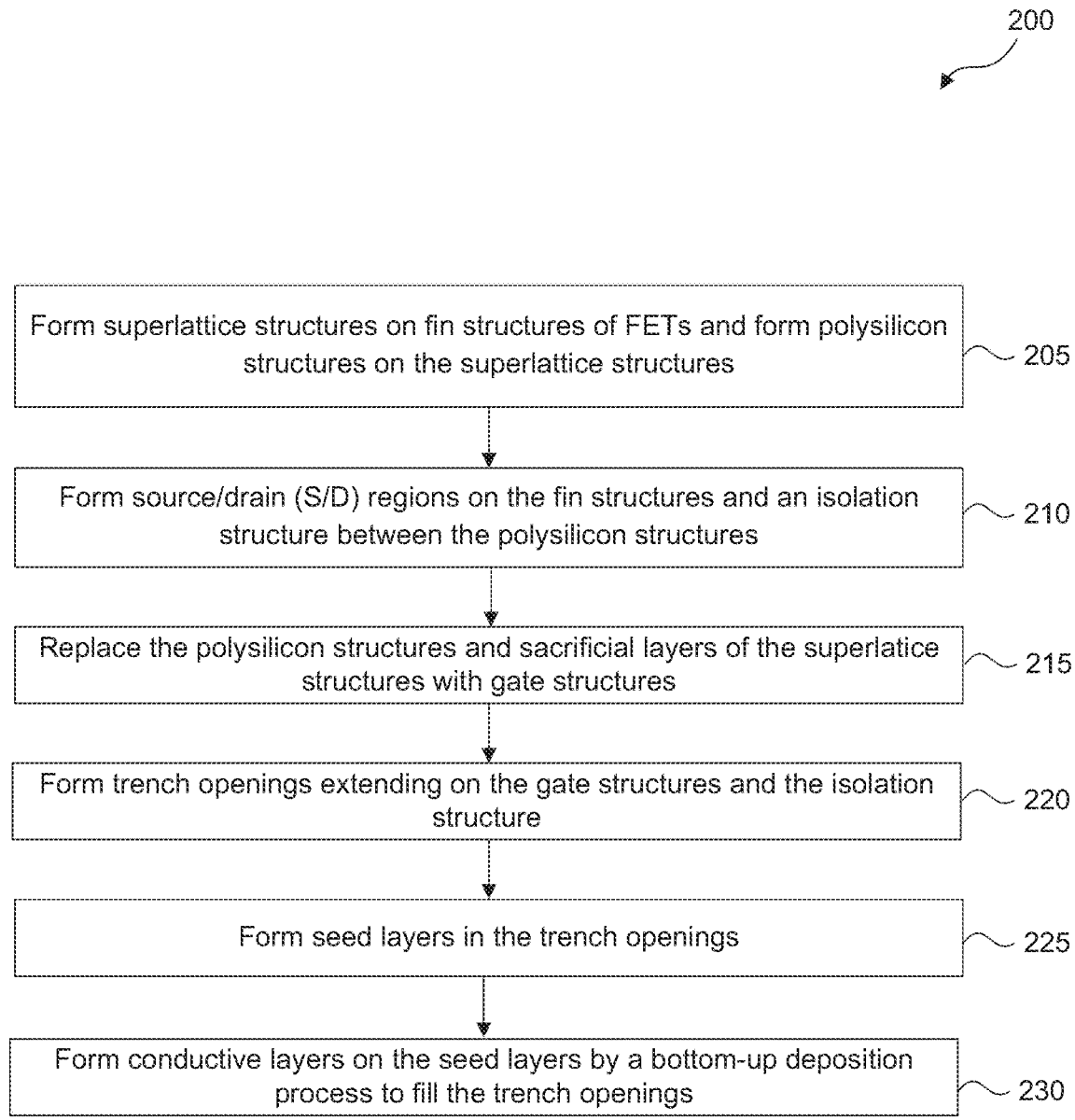
FIG. 2 is a flow diagram of a method for fabricating a semiconductor device with contact structures, in accordance with some embodiments.
Figure 3:
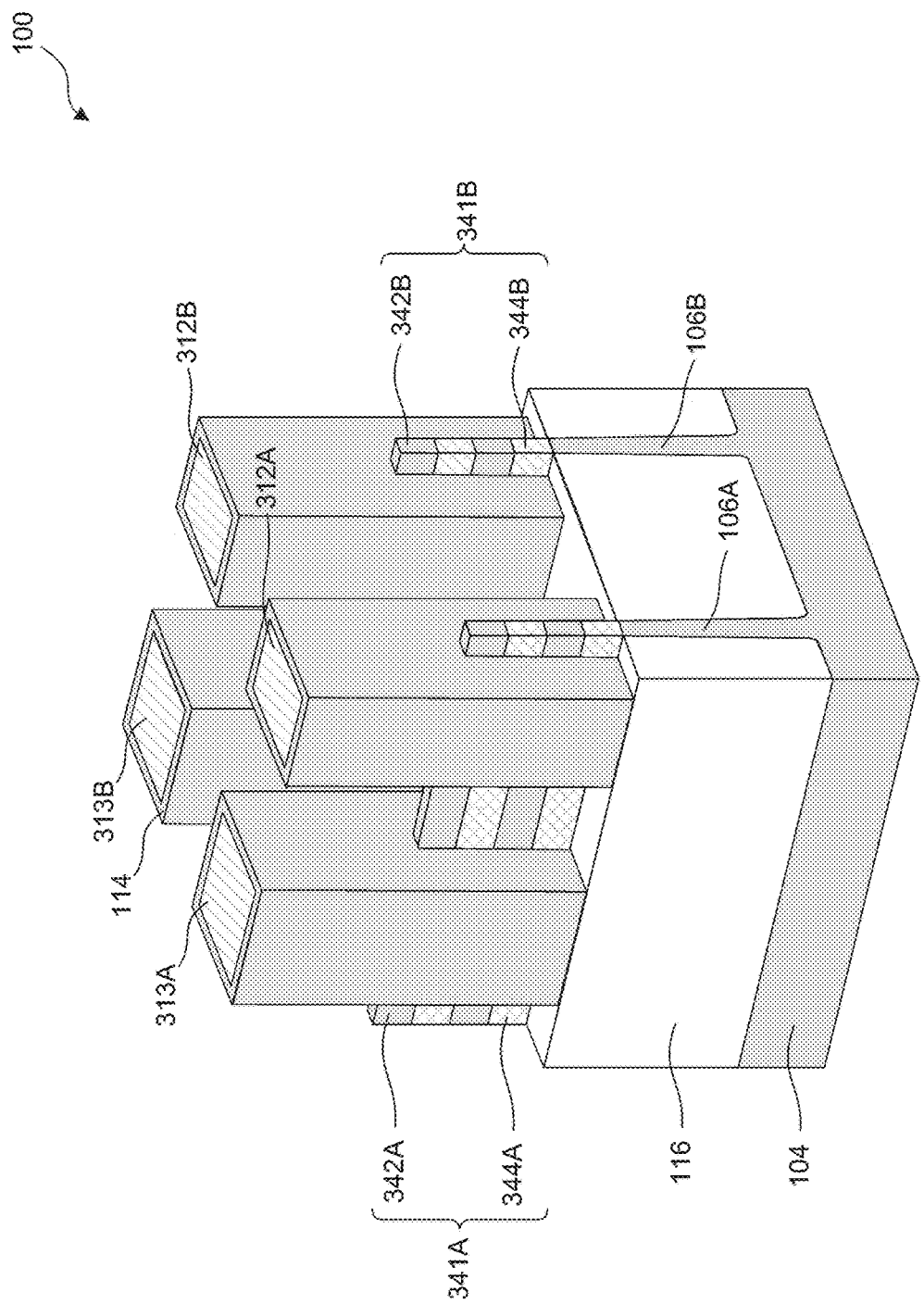
FIGS. 3 and 4A-18B illustrate isometric and cross-sectional views of a semiconductor device with contact structures at various stages of its fabrication process, in accordance with some embodiments.

FIG. 2 is a flow diagram of an example method 200 for fabricating semiconductor device 100, according to some embodiments. For illustrative purposes, the operations illustrated in FIG. 2 will be described with reference to the example fabrication process for fabricating semiconductor device 100 as illustrated in FIGS. 3 and 4A-18B. FIG. 3 is an isometric view of semiconductor device 100, FIGS. 4A-18A are cross-sectional views of semiconductor device 100 along line A-A of FIG. 1B, and FIGS. 4B-18B are cross-sectional views of semiconductor device 100 along line B-B of FIG. 1B at various stages of fabrication, according to various embodiments. Operations of method 200 can be performed in a different order or not performed depending on specific applications. It should be noted that method 200 may not produce complete semiconductor device 100. Accordingly, it is understood that additional processes can be provided before, during, and after method 200, and that some other processes may only be briefly described herein. Elements in FIGS. 3 and 4A-18B with the same annotations as elements in FIGS. 1A-1E are described above.

In operation 205, superlattice structures are formed on fin structures of FETs, and polysilicon structures are formed on the superlattice structures. For example, as shown in FIG. 3, superlattice structures 341A and 341B are formed on fin structures 106A and 106B, respectively, polysilicon structures 312A-313A are formed on superlattice structure 341A, and polysilicon structures 312B-313B are formed on superlattice structure 341B. Superlattice structure 341A can include nanostructured layers 342A and 344A arranged in an alternating configuration. Similarly, superlattice structure 341B can include nanostructured layers 342B and 344B arranged in an alternating configuration. In some embodiments, nanostructured layers 342A-342B include materials similar to each other and nanostructured layers 344A-344B include materials similar to each other. Nanostructured layers 344A and 344B are also referred to as sacrificial layers 344A and 344B.

Figure 4A:
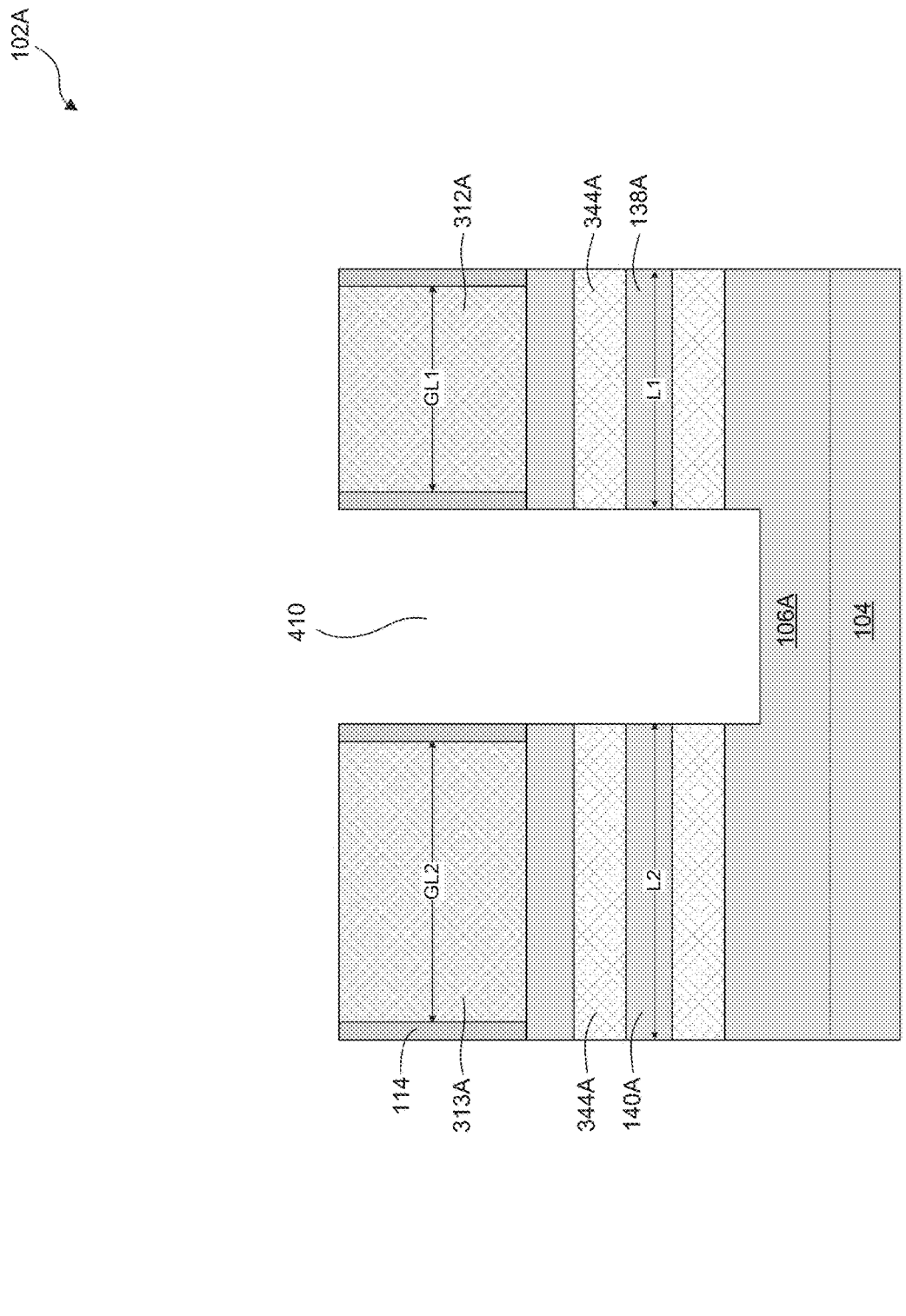
Figure 4B:
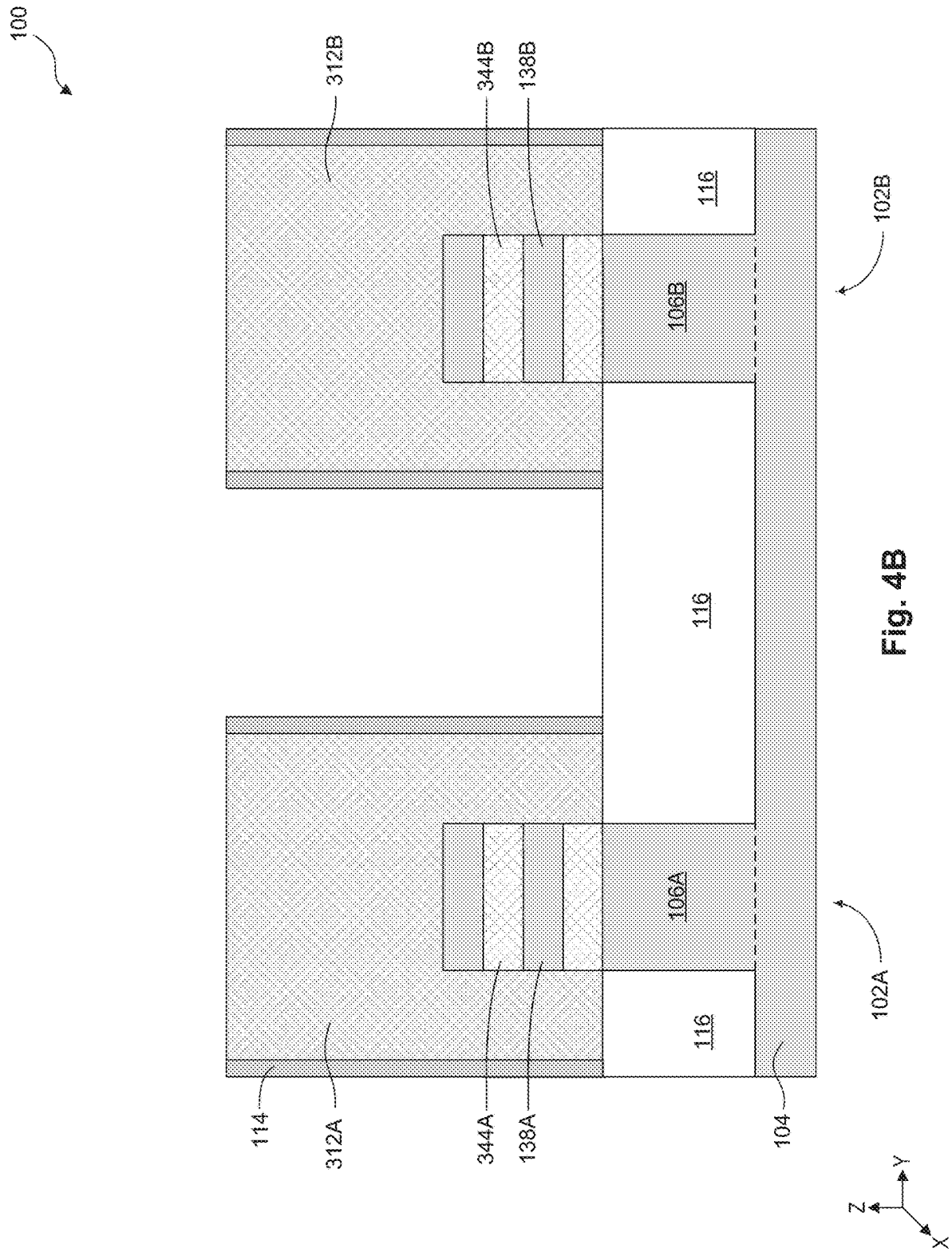
Figure 5A:
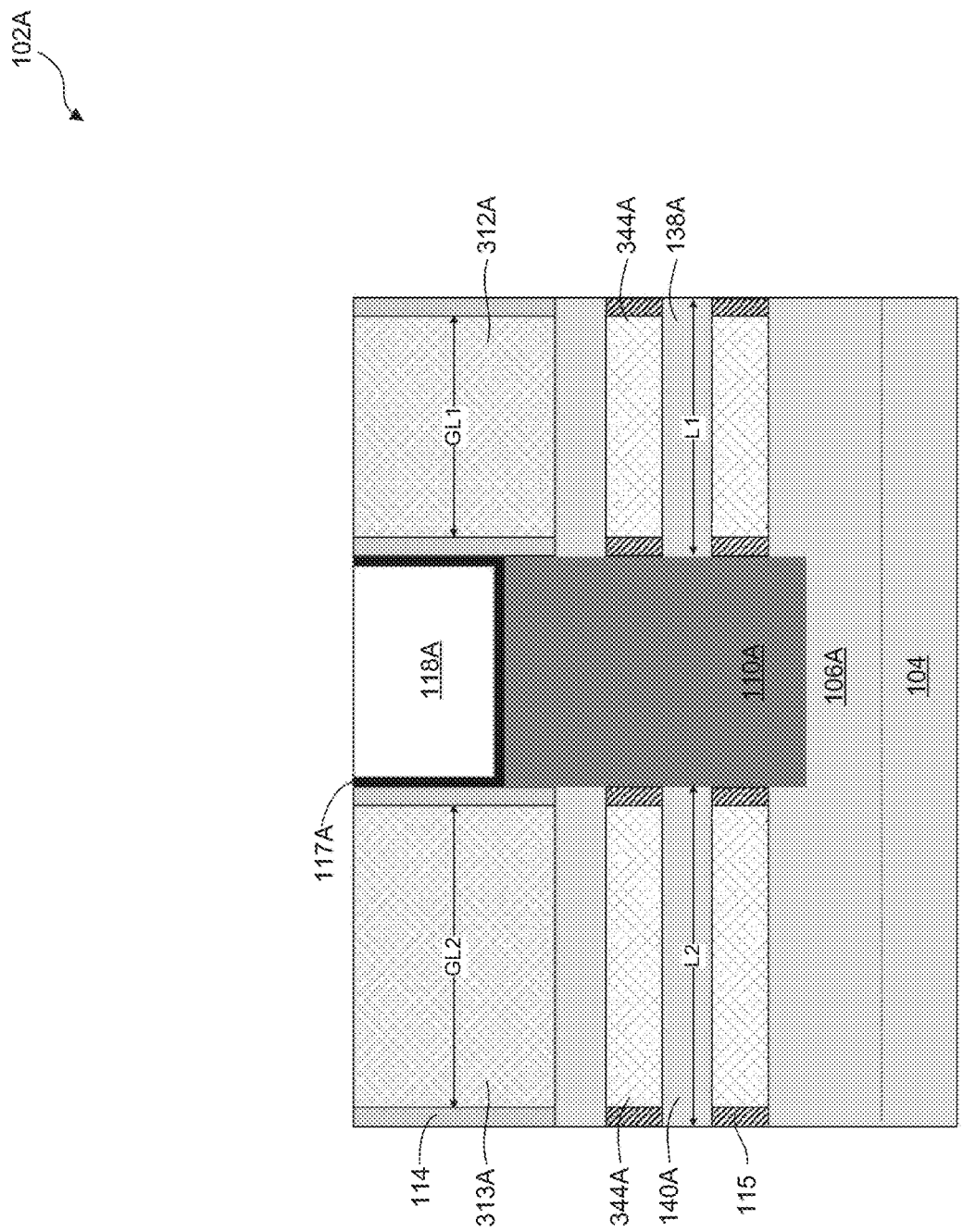
Figure 5B:
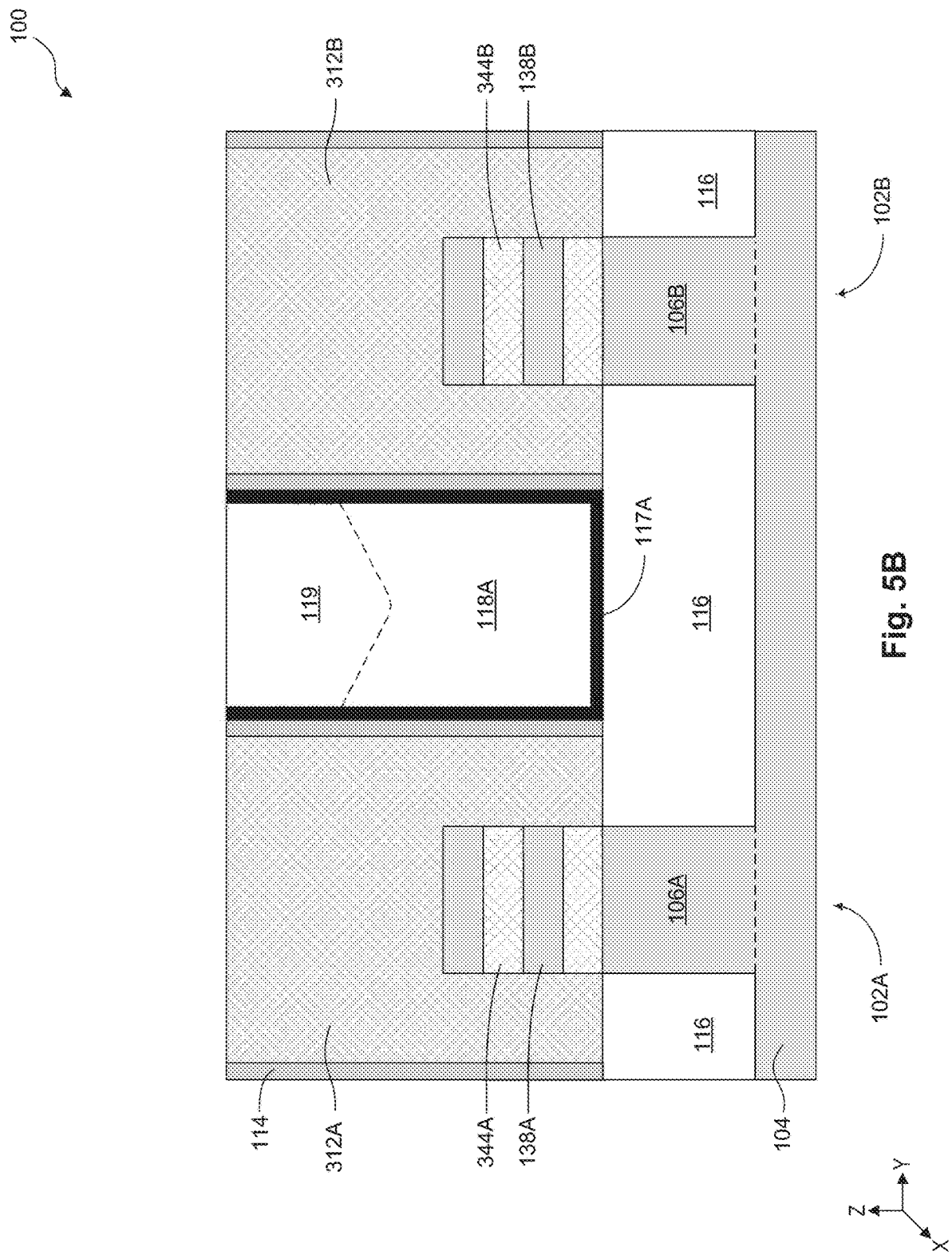

Referring to FIG. 2, in operation 210, S/D regions are formed on the fin structures and an isolation structure is formed between the polysilicon structures. For example, as described with reference to FIGS. 4A-5B, S/D region 110A is formed on fin structures 106A and ILD layer 118A is formed between polysilicon structures 312A-313A. ILD layer 118A can act as an isolation structure between polysilicon structures 312A-313A. The formation of S/D region 110A can include sequential operations of (i) forming S/D opening 410, through superlattice structure 341A, on a portion of fin structure 106A that is not underlying polysilicon structures 312A-313A, as shown in FIG. 4A, and (ii) epitaxially growing semiconductor materials within S/D opening 410, as shown in FIG. 5A. In some embodiments, inner spacers 115 can be formed between operations (i) and (ii) of the formation process of epitaxial S/D region 110A, as shown in FIG. 5A. After the formation of S/D region 110A, ESL 117A and ILD layer 118A can be formed on S/D region 110A to form the structures of FIGS. 5A-5B. In some embodiments, isolation structure 119 (shown in FIG. 5B) can be formed after the formation of ILD layer 118A.

Figure 6A:
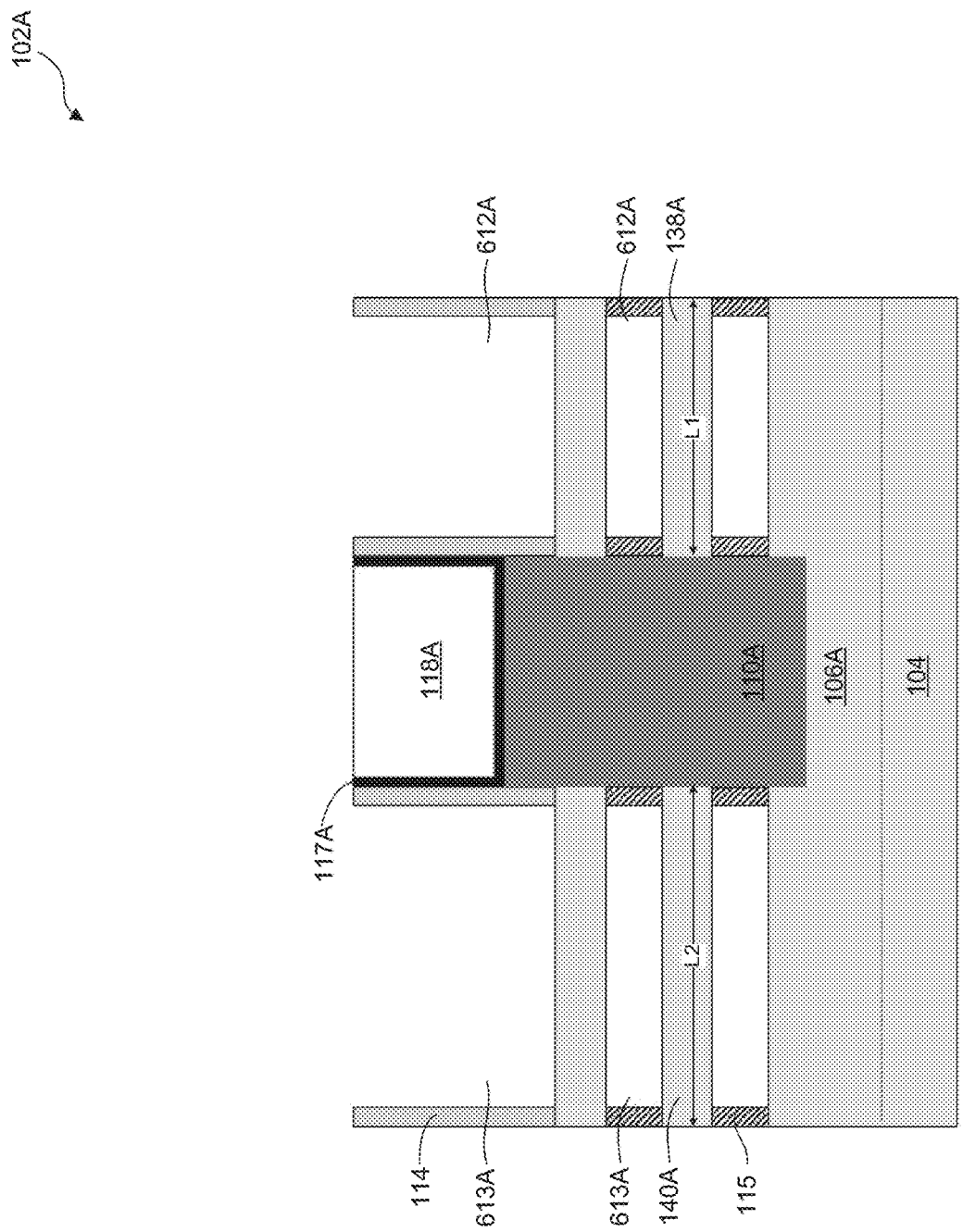
Figure 6B:
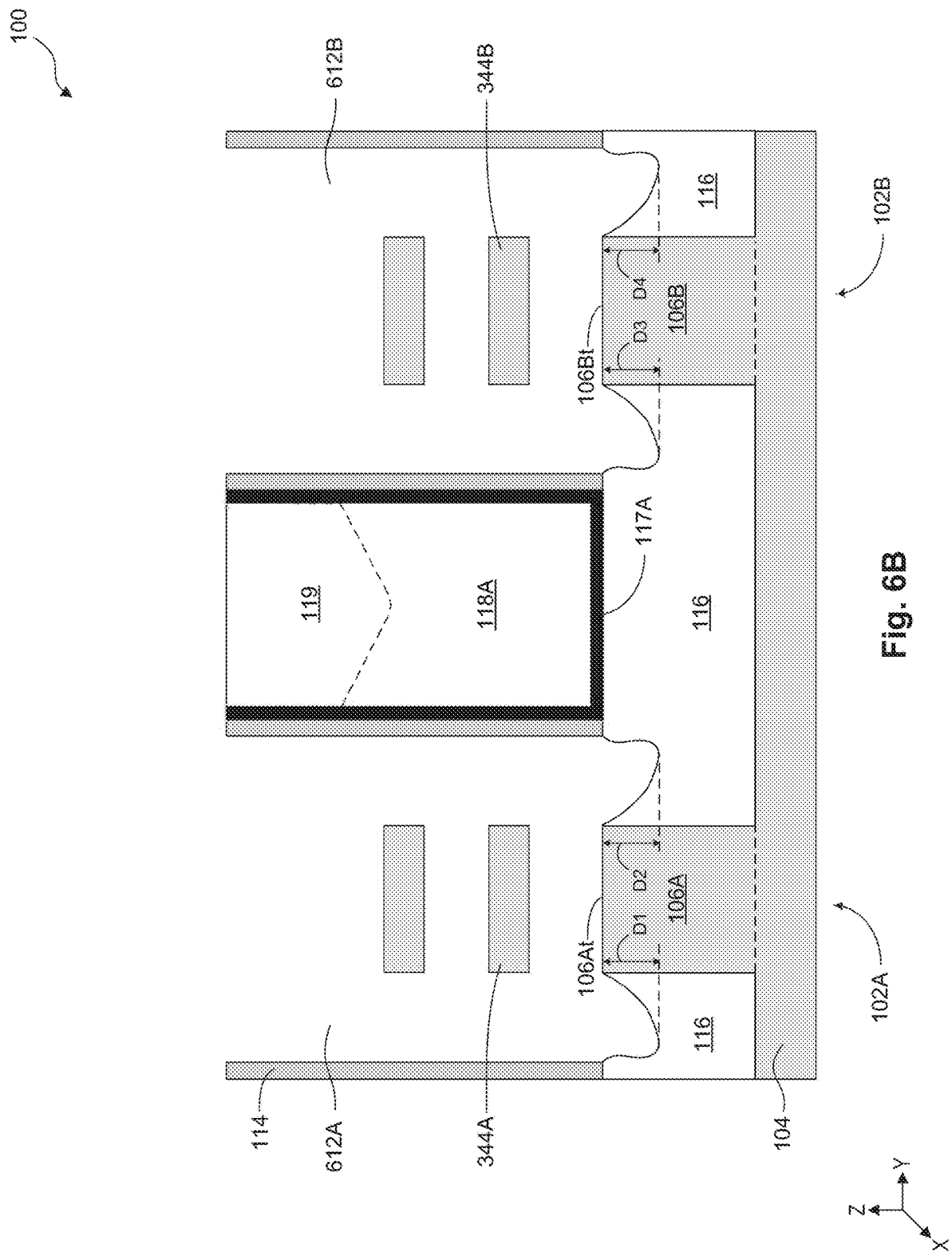
Figure 7A:
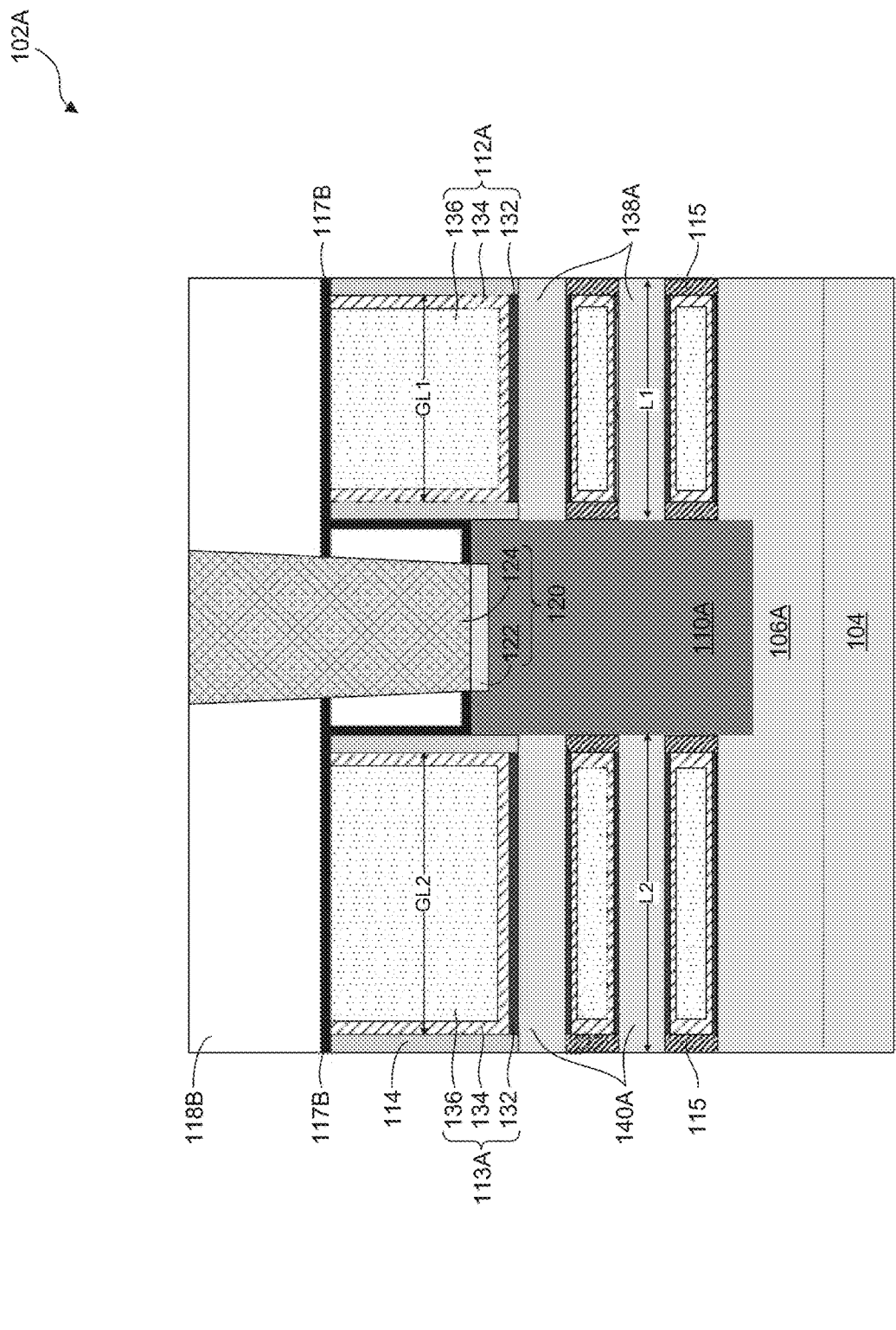
Figure 7B:
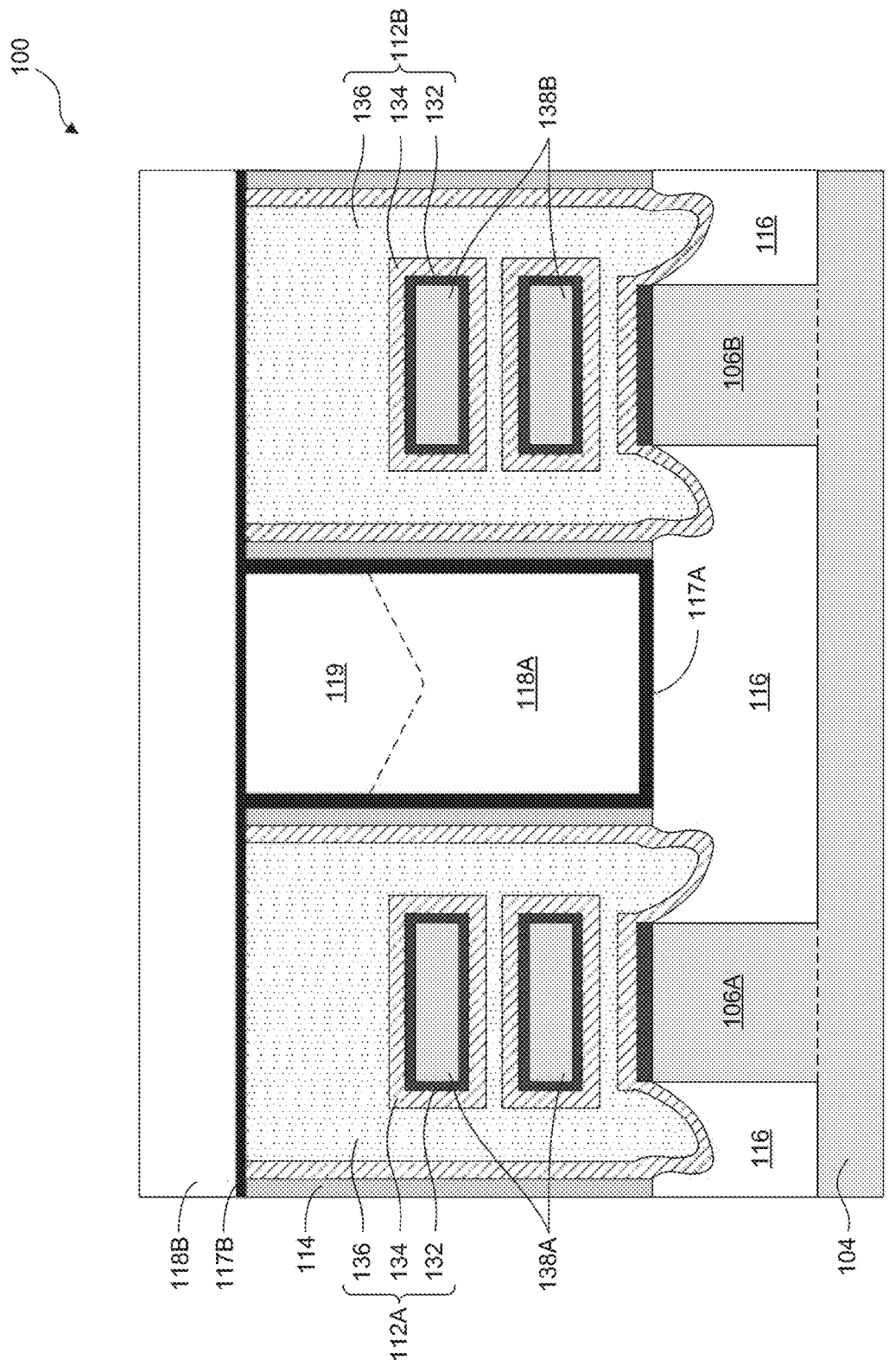

Referring to FIG. 2, in operation 215, the polysilicon structures and sacrificial layers of the superlattice structures are replaced with gate structures. For example, as described with reference to FIGS. 6A-7B, polysilicon structures 312A, 312B, 313A, and 313B (not shown in FIGS. 6A-7B) and sacrificial layers 344A and 344B are replaced with gate structures 112A, 112B, 113A, and 113B(not shown in FIGS. 6A-7B). The gate replacement process can include sequential operations of (i) removing polysilicon structures 312A, 312B, and 313A and sacrificial layers 344A and 344B from the structures of FIGS. 5A-5B to form gate openings 612A, 612B, and 613A, as shown in FIGS. 6A-6B, (ii) forming IO oxide layers 132 within gate openings 612A, 612B, and 613A, as shown in FIGS. 7A-7B, (iii) forming HK dielectric layers 134 on IO oxide layers 132 within gate openings 612A, 612B, and 613A, as shown in FIGS. 7A-7B, and (iv) forming conductive layers 136 on HK dielectric layers 134 within gate openings 612A, 612B, and 613A, as shown in FIGS. 7A-7B. In some embodiments, along with polysilicon structures 312A, 312B, and 313A, portions of STI regions 116 underlying polysilicon structures 312A, 312B, and 313A are etched, as shown in FIG. 6B. The portions of STI regions 116 are etched to ensure that no residual materials of polysilicon structures 312A, 312B, and 313A remains at the bottom corners and/or edges of gate openings 612A-612B (shown in FIG. 6B) and 613A-613B (not shown). In some embodiments, gate opening 612A can extend distances D1-D2 below top surface 106At of fin structure 106A and gate opening 612B can extend distances D3-D4 below top surface 106Bt of fin structure 106B, as shown in FIG. 6B. In some embodiments, distances D1-D4 can be substantially equal or different from each other. In some embodiments, distances D1-D4 can range from about 1 nm to about 10 nm. After the formation of gate structures, ESL 117B, ILD layer 118B and S/D contact structure 120 can be formed, as shown in FIGS. 7A-7B.

Figure 8A:
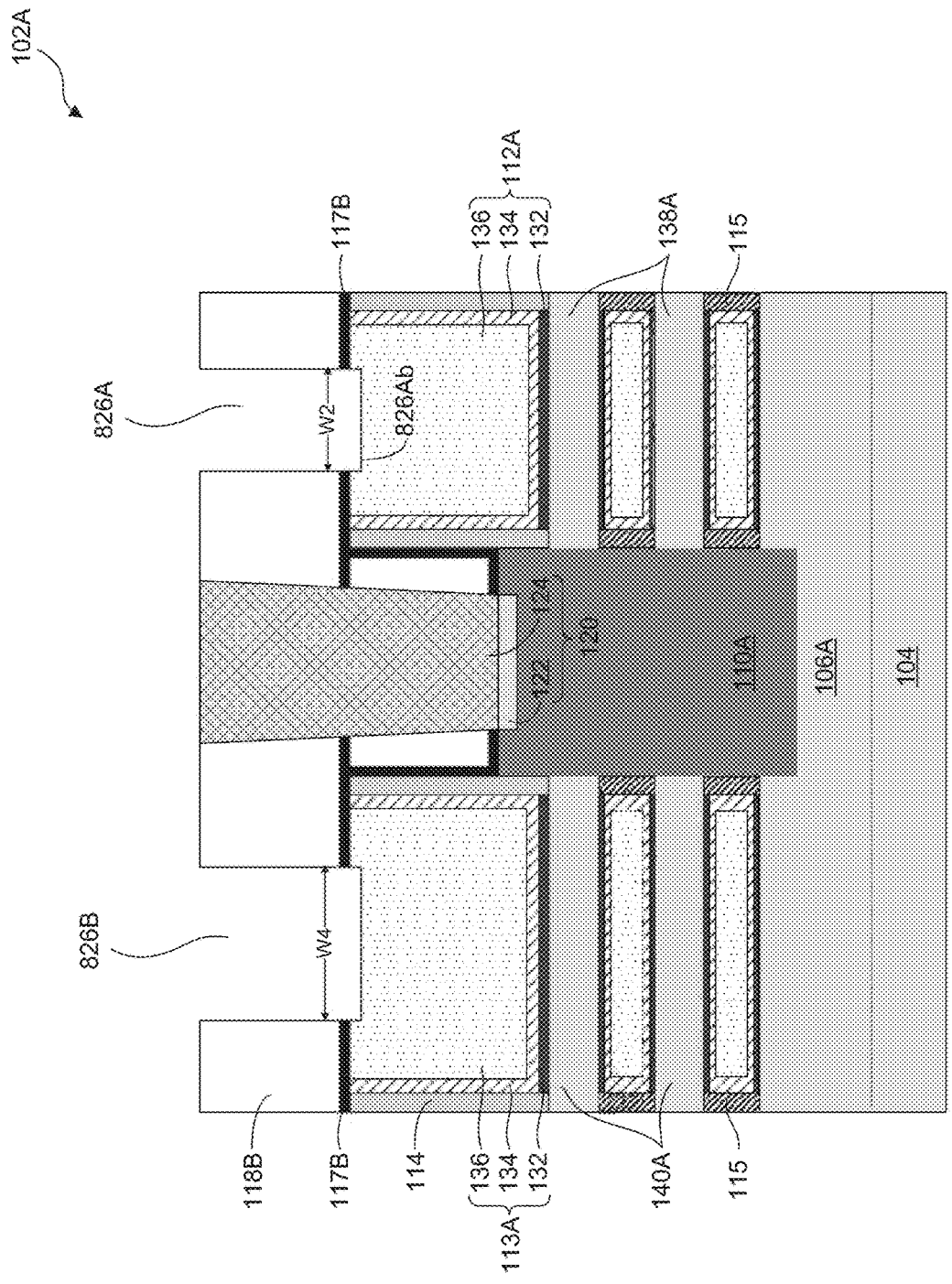
Figure 9A:
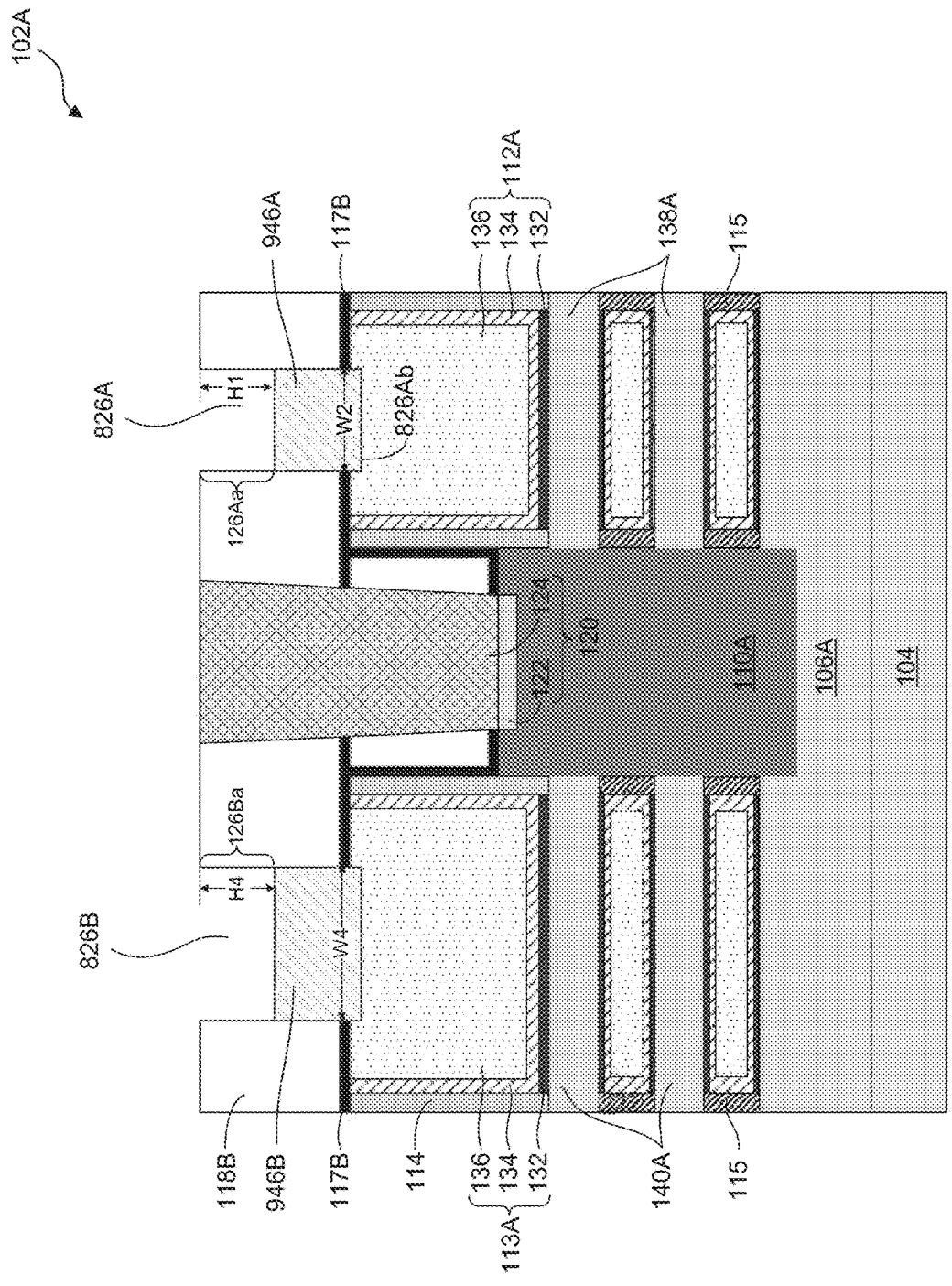
Figure 9B:
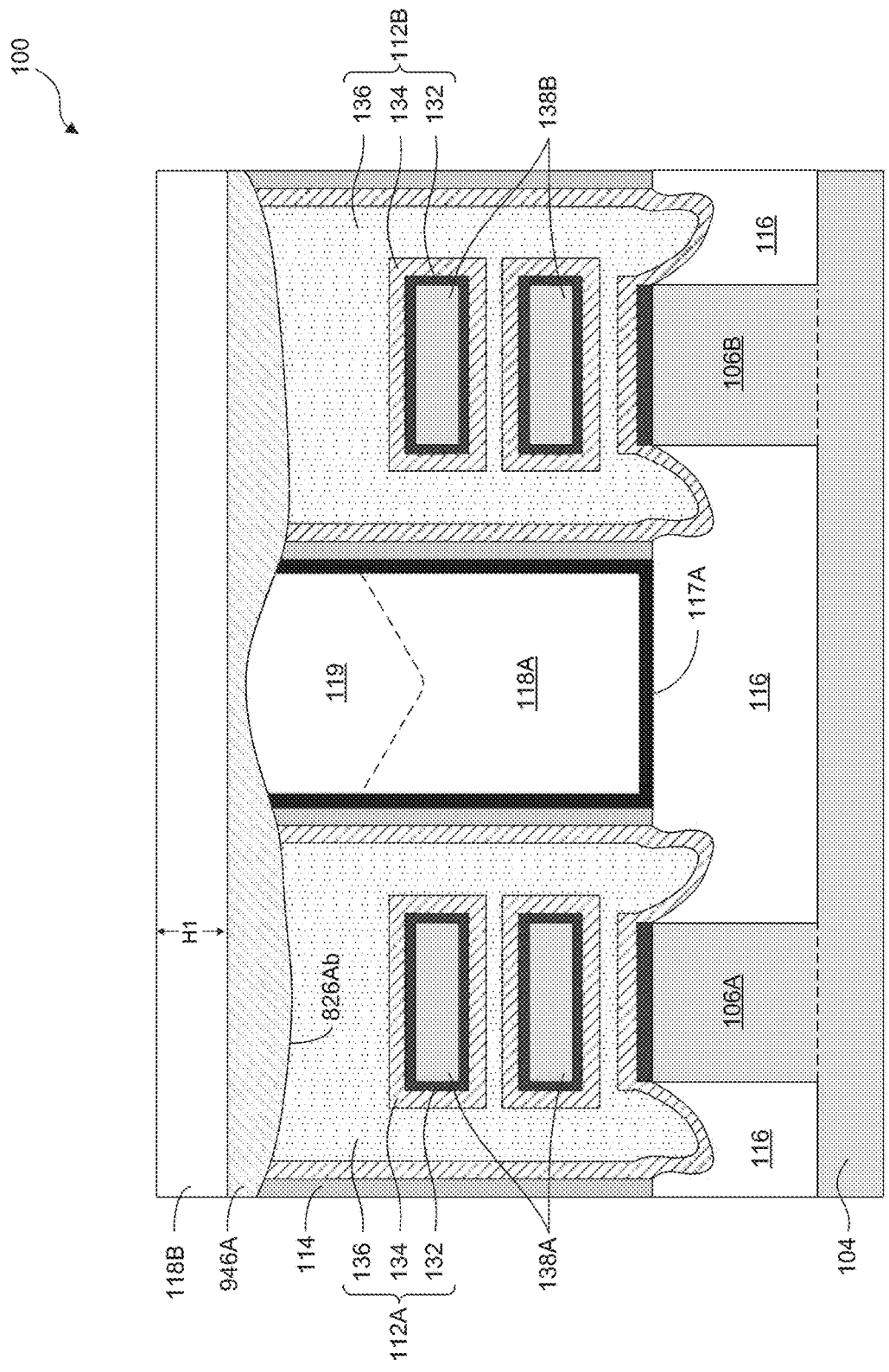

Referring to FIG. 2, in operation 220, trench openings are formed extending on the gate structures and the isolation structure. For example, as described with reference to FIGS. 8A-10B, a trench opening 1026A is formed on gate structures 112A-112B and ILD layer 118A (or on isolation structure 119 if present) and a trench opening 1026B is formed on gate structures 113A-113B and ILD layer 118A (or on isolation structure 119, if present). The formation of trench openings 1026A-1026B can include sequential operations of (i) forming trench openings 826A-826B by etching ILD layer 118B, ESL 117B, and conductive layers 136, as shown in FIGS. 8A-8B, (ii) forming masking layers 946A-946B within trench openings 826A-826B, as shown in FIGS. 9A-9B, (iii) laterally etching ILD layer 118B exposed in top portions 126Aa-126Ba of trench openings 826A-826B to form the structures of FIGS. 10A-10B, and (iv) removing masking layers 946A-946B.

In some embodiments, trench openings 826A-826B can be formed by a dry etching process and widths W2-W4 of trench openings 826A-826B define widths W2-W4 of bottom portions 126Ac-126Bc of gate contact structures 126A-126B formed in subsequent processing. The bottom surface 826Ab of trench opening 826A can be non-uniform, as shown in FIG. 8B, due to the different etching rates of the different materials of gate structures 112A-112B, gate spacers 114, ESL 117A, and ILD layer 118A. In some embodiments, a vertical distance D5 between a highest point ("peak point") and a lowest point ("valley point") on bottom surface 826Ab can range from about 0.5 nm to about 2 nm. FIG. 8B shows bottom surface 826Ab of trench opening 826A, but does not show the sidewall of trench opening 826A for simplicity. Trench opening 826B can have bottom surface similar to bottom surface 826Ab.

Figure 10A:
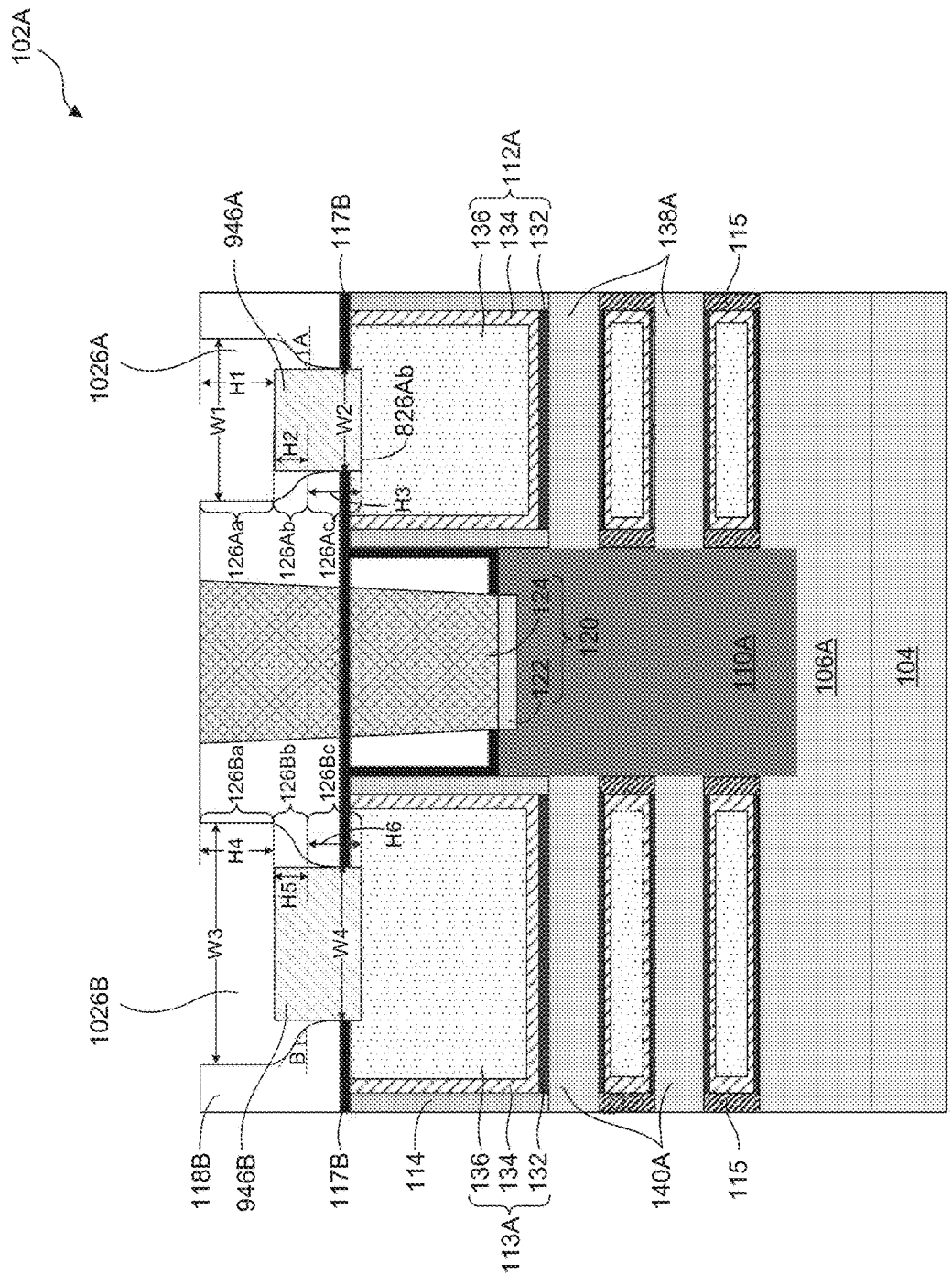
Figure 10B:
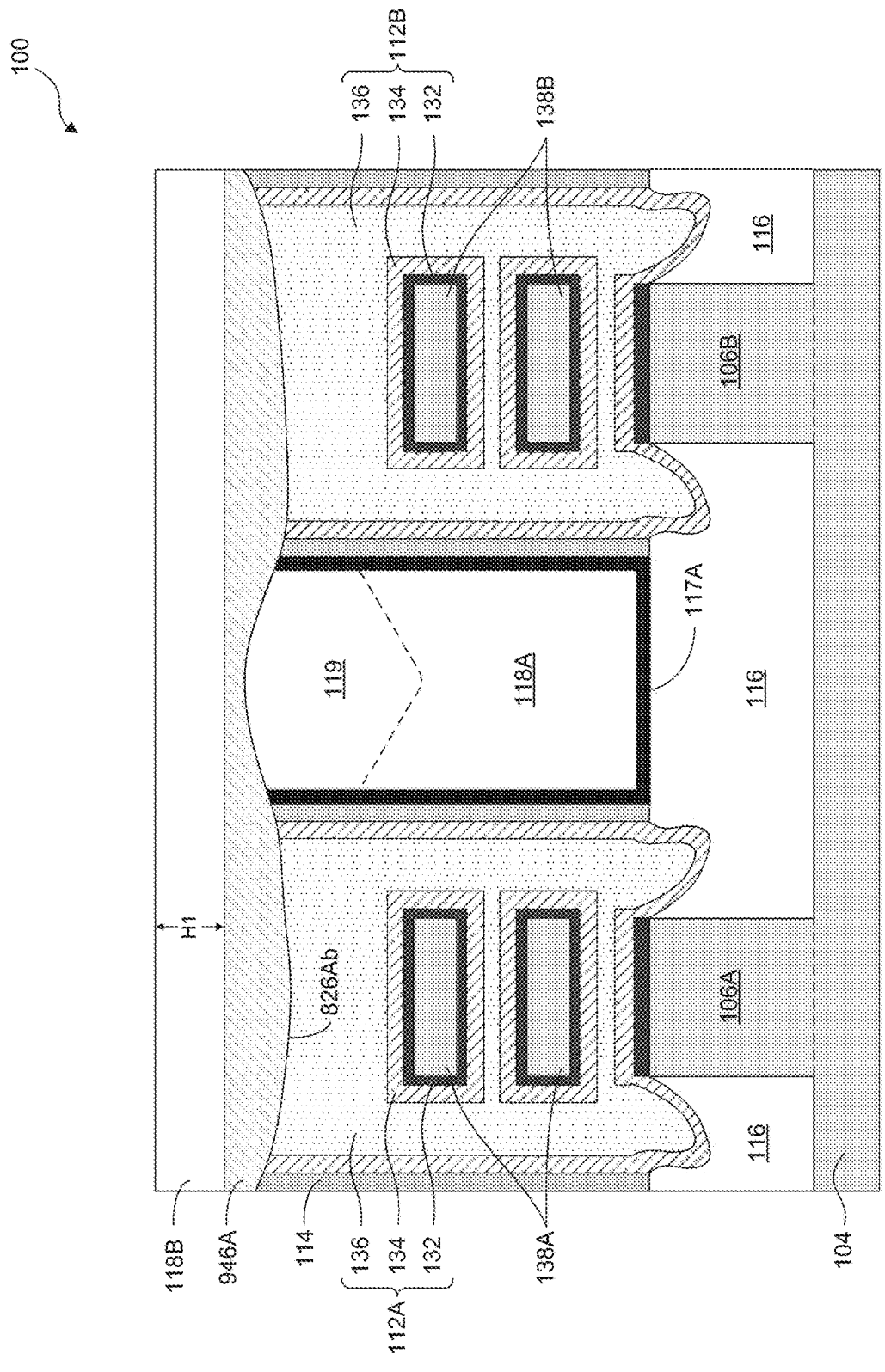

In some embodiments, masking layers 946A-946B protects the shape and dimensions of bottom portions of trench openings 826A-826B while top portions of trench openings 826A-826B are laterally etched to form the wider top portions 126Aa-126Ba of trench openings 1026A-1026B, as shown in FIG. 10A. In some embodiments, the lateral etching can be done by wet etching, plasma etching, or other suitable etching methods for lateral etch. Widths W1-W3 of trench openings 1026A-1026B define widths W1-W3 of top portions 126Aa-126Ba of gate contact structures 126A-126B formed in subsequent processing.

Figure 12A:
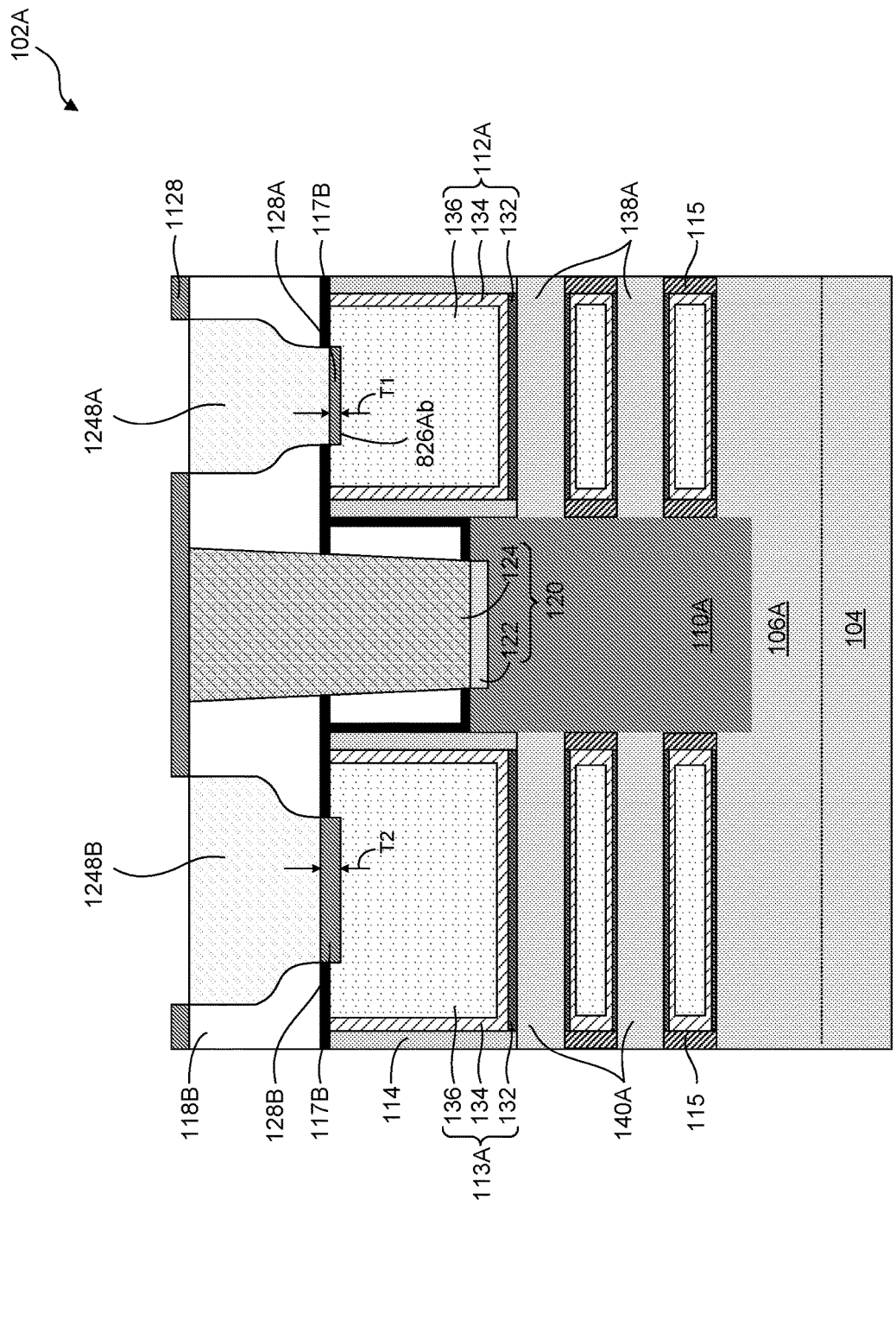
Figure 12B:
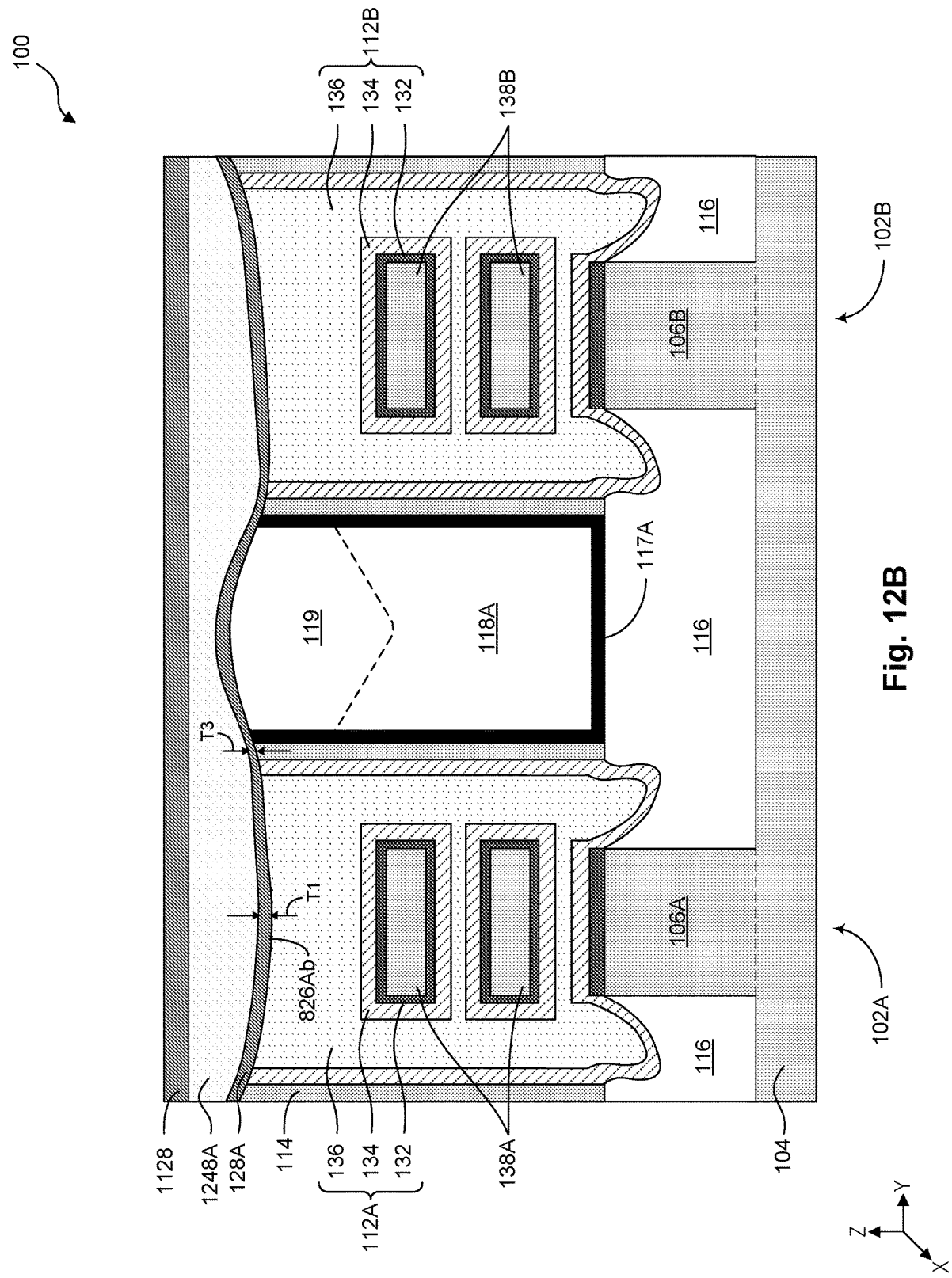
Figure 13A:
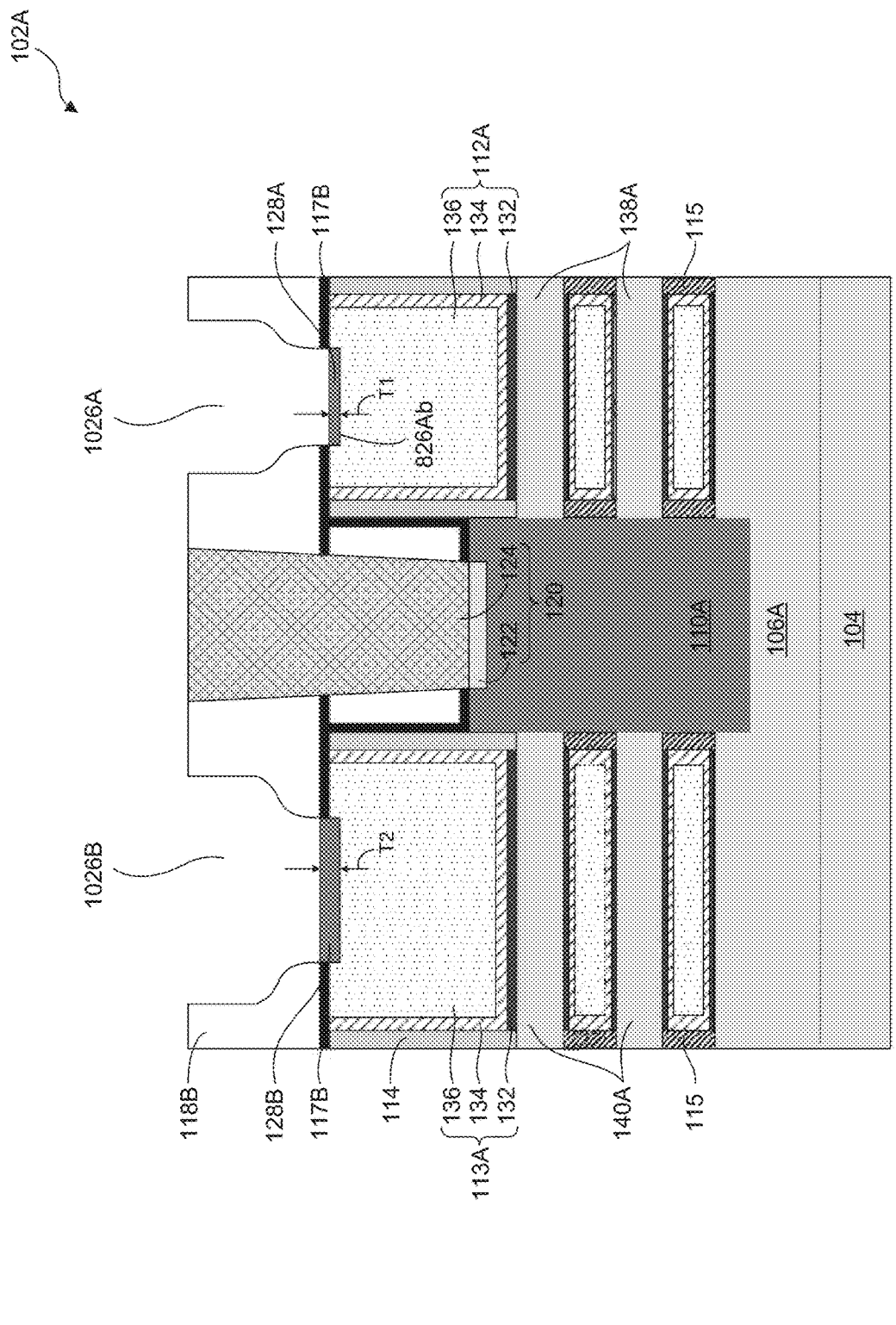
Figure 13B:
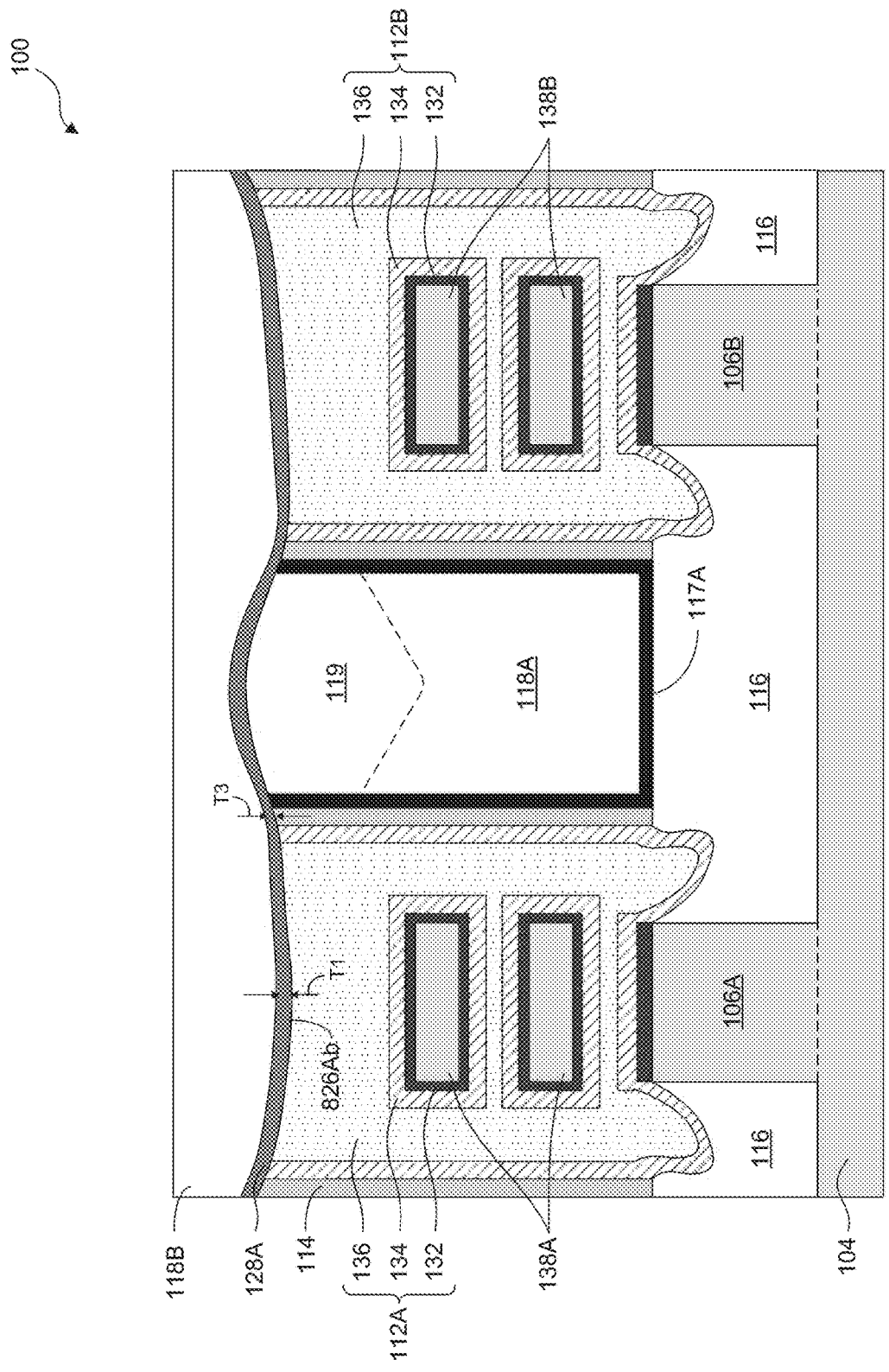

Referring to FIG. 2, in operation 225, seed layers are formed in the trench openings. For example, as described with reference to FIGS. 11A-13B, seed layers 128A-128B are formed in trench openings 1026A-1026B. The formation of seed layers 128A-128B can include sequential operations of (i) depositing a seed layer material 1128 on the structures of FIGS. 10A-10B after removing masking layers 946A-946B to form the structures of FIGS. 11A-11B, (ii) etching portions of seed layer material 1128 from sidewalls of trench openings 1026A-1026B, as shown in FIG. 12A, (iii) filling trench openings 1026A-1026B with masking layers 1248A-1248B to form the structures of FIGS. 12A-12B, (iv) performing an etching process on the structures of Fins 12A-12B to remove nortions of seed layer material 112g on ILD layer 118B and S/D contact structure 120, as shown in FIG. 13A, and (v) removing masking layers 1248A-1248B to form the structures of FIGS. 13A-13B.

Figure 11A:
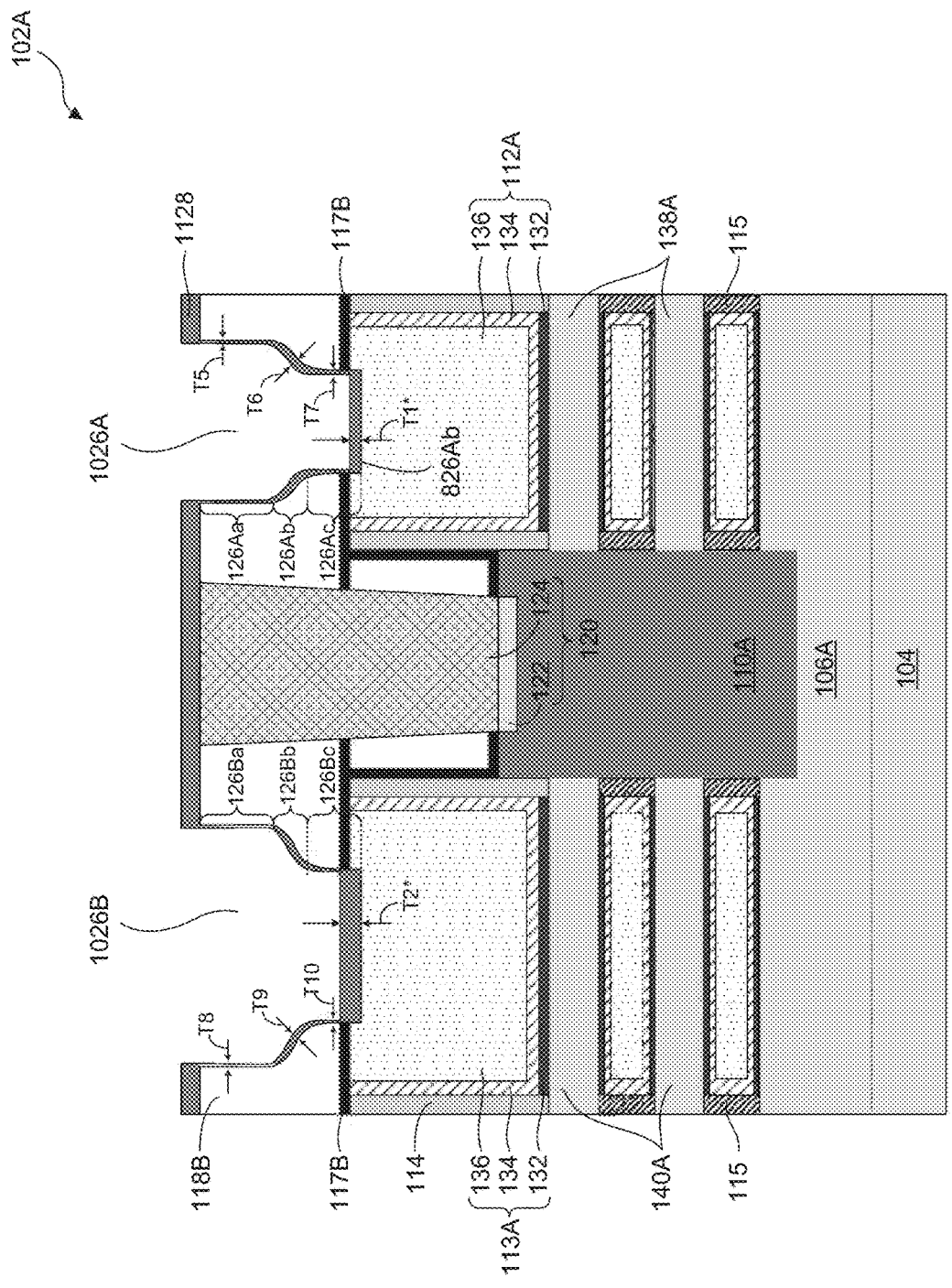
Figure 11B:
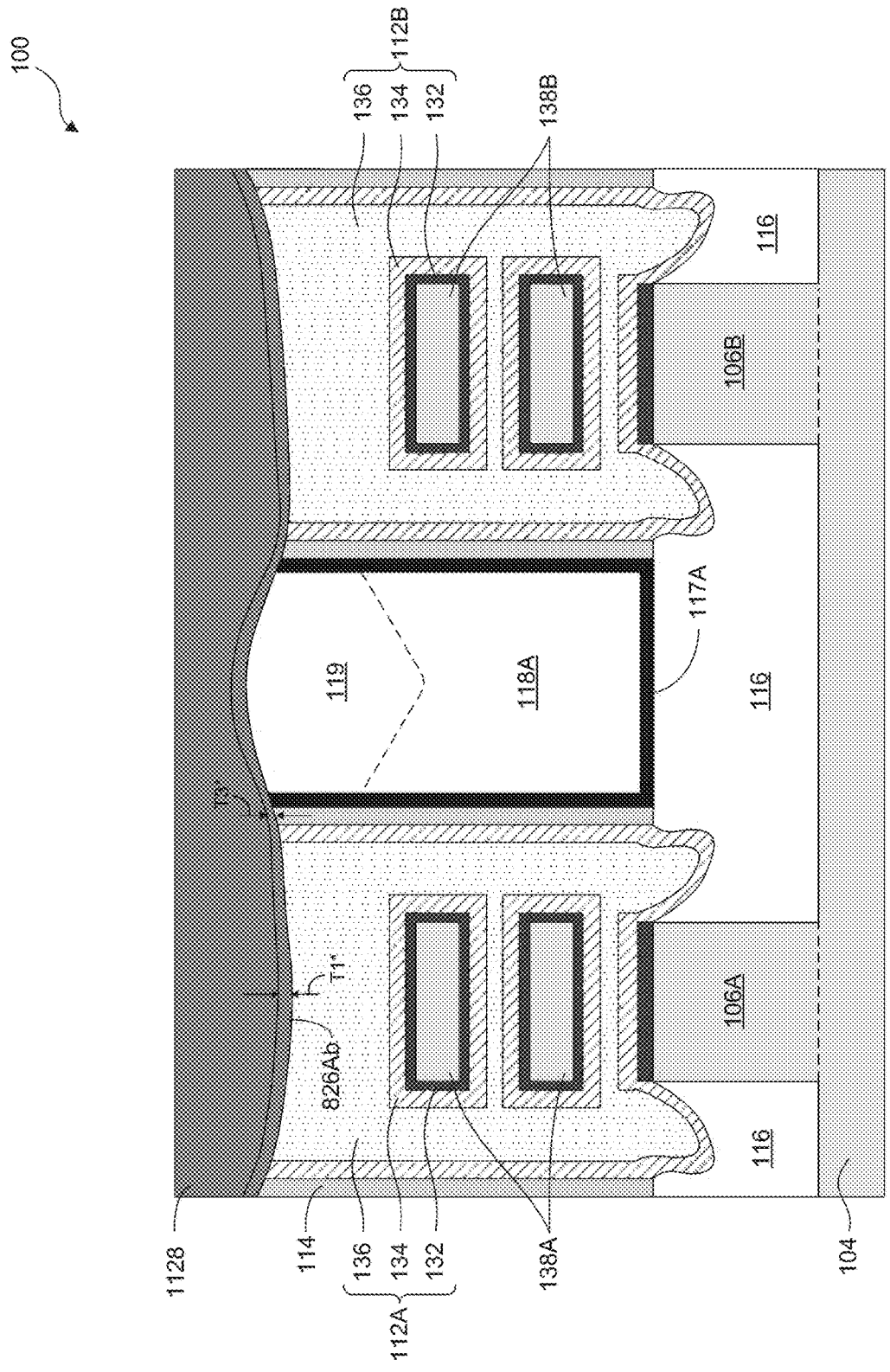

The parameters of the deposition process for depositing seed layer material 1128 are controlled to form thicker portions of seed layer material 1128 at the bottom of trench openings 1026A-1026B than the portions of seed layer material 1128 along the sidewalls of trench openings 1026A-1026B, as shown in FIG. 11A. The thinner portions along the sidewalls of trench openings 1026A-1026B facilitate in selectively etching the sidewall portions of seed layer material 1128 without significantly etching the thicker portions of seed layer material 1128 at the bottom of trench openings 1026A-1026B. The portions of seed layer material 1128 at the bottom of trench openings 1026A-1026B can have thicknesses T1*-T2*, which are greater than thicknesses T5-T10 of the portions of seed layer material 1128 along the sidewalls of trench openings 1026A-1026B. In some embodiments, thicknesses T5-T10 can be less than about 1.5 nm (e.g., about 0.1 nm, about 0.5 nm, about, 0.7 nm, and about 1 nm). In some embodiments, due to the curved or sloped sidewalls of transition portions, thicknesses T6 and T9 can be thicker than thicknesses T5, T7, T8, and T10. In some embodiments, a small amount of the portions of seed layer material 1128 at the bottom of trench openings 1026A-1026B can be etched during etching the portions of seed layer material 1128 from sidewalls of trench openings 1026A-1026B and the thickness T1*-T3* can be reduced to thicknesses T1-T3, as shown in FIGS. 12A-12B.

In some embodiments, a physical vapor deposition (PVD) process with plasma can be used to deposit seed layer material 1128. To achieve the thicker bottom portions of seed layer material 1128 than the sidewall portions of seed layer material 1128, a high pressure greater than about 60 mTorr (e.g., ranging from about 61 mTorr to about 150 mTorr) can be maintained in the deposition chamber, an RF plasma with a frequency between about 14 MHz and 60 MHz can be used to ionize the atoms of seed layer material 1128 from a target material, and a bias voltage can be applied to substrate 104 to attract and direct the ionized atoms towards the bottom of trench openings 1026A-1026B.

Figure 14A:
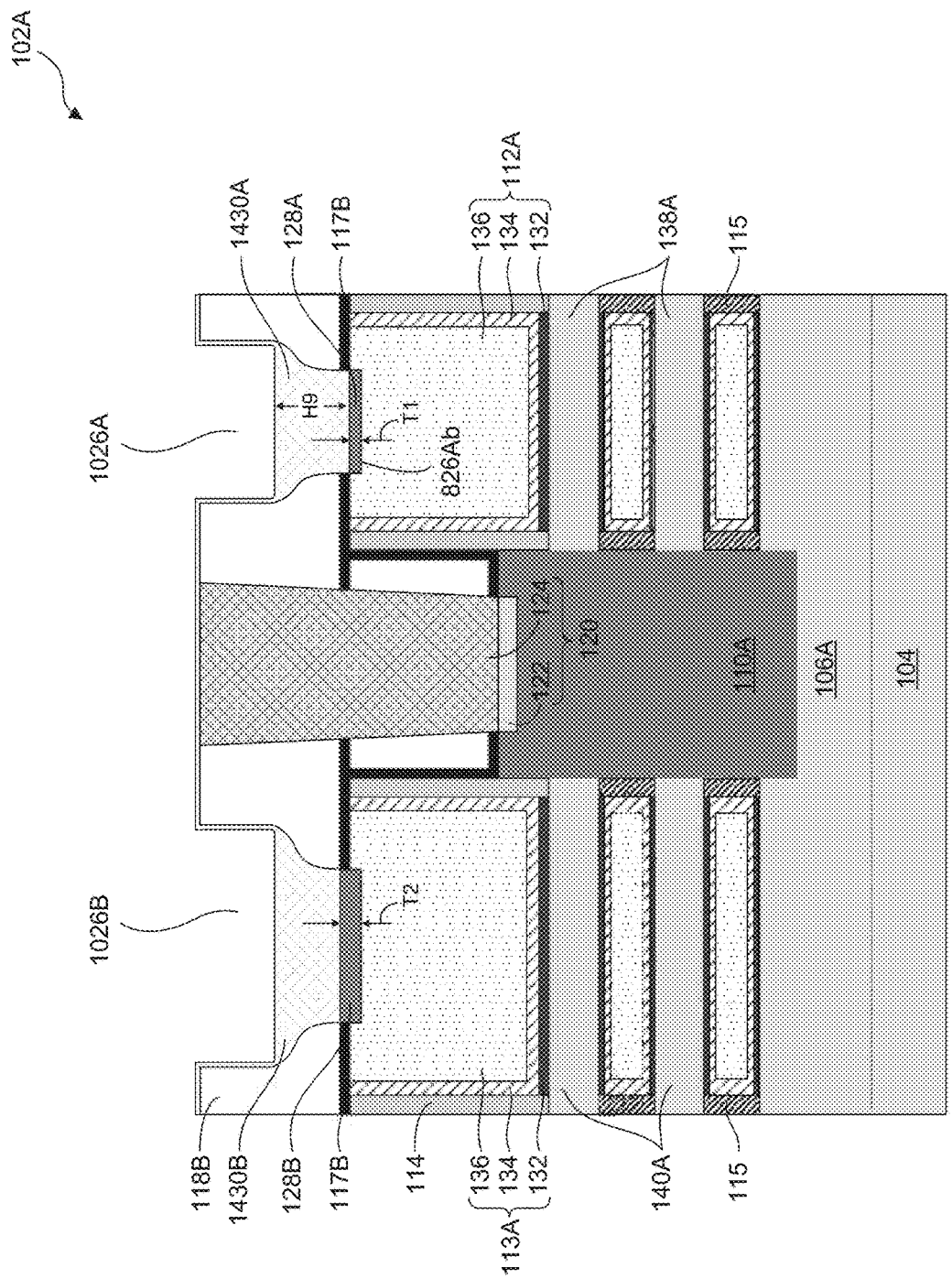
Figure 14B:
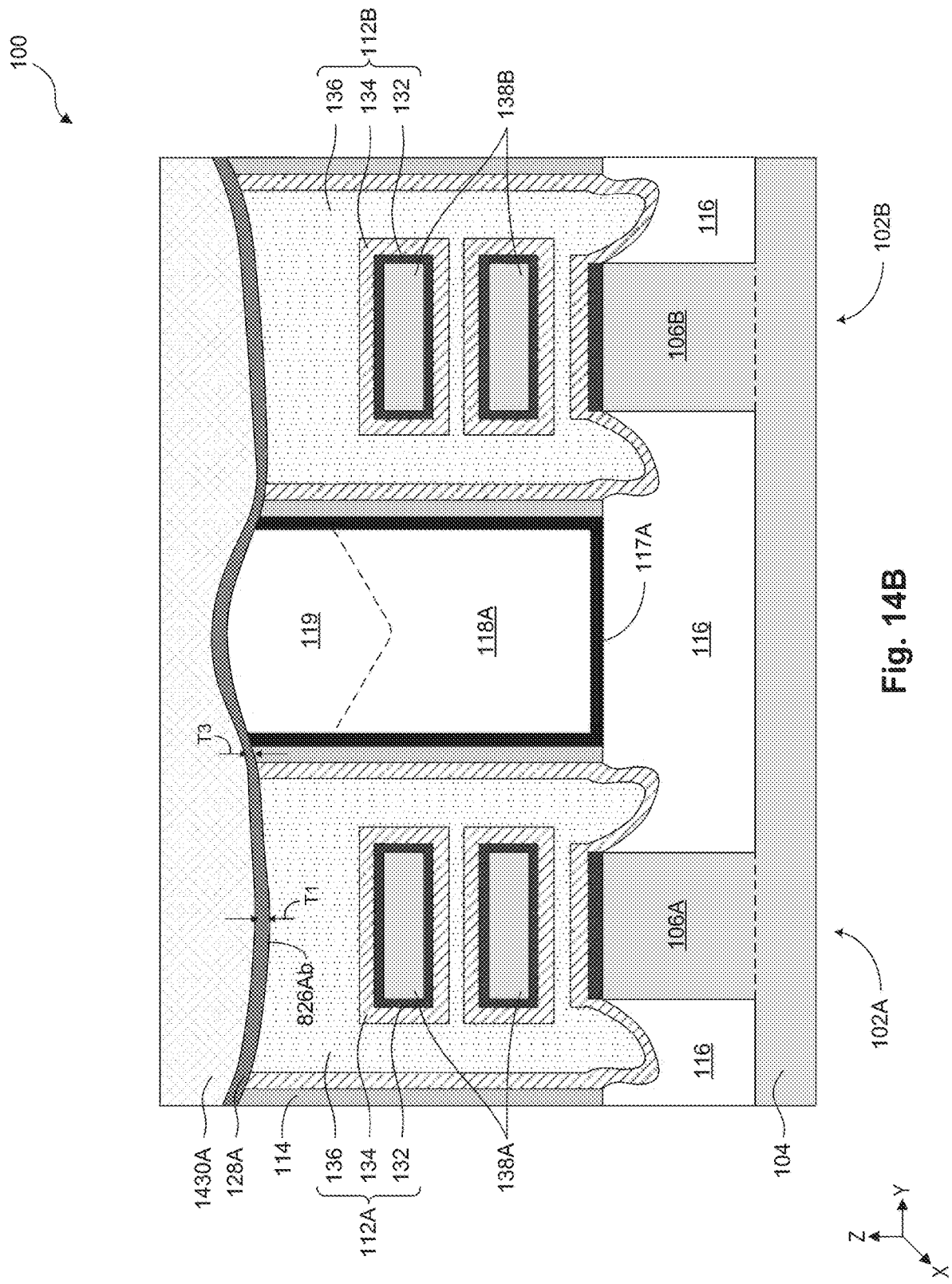
Figure 15A:
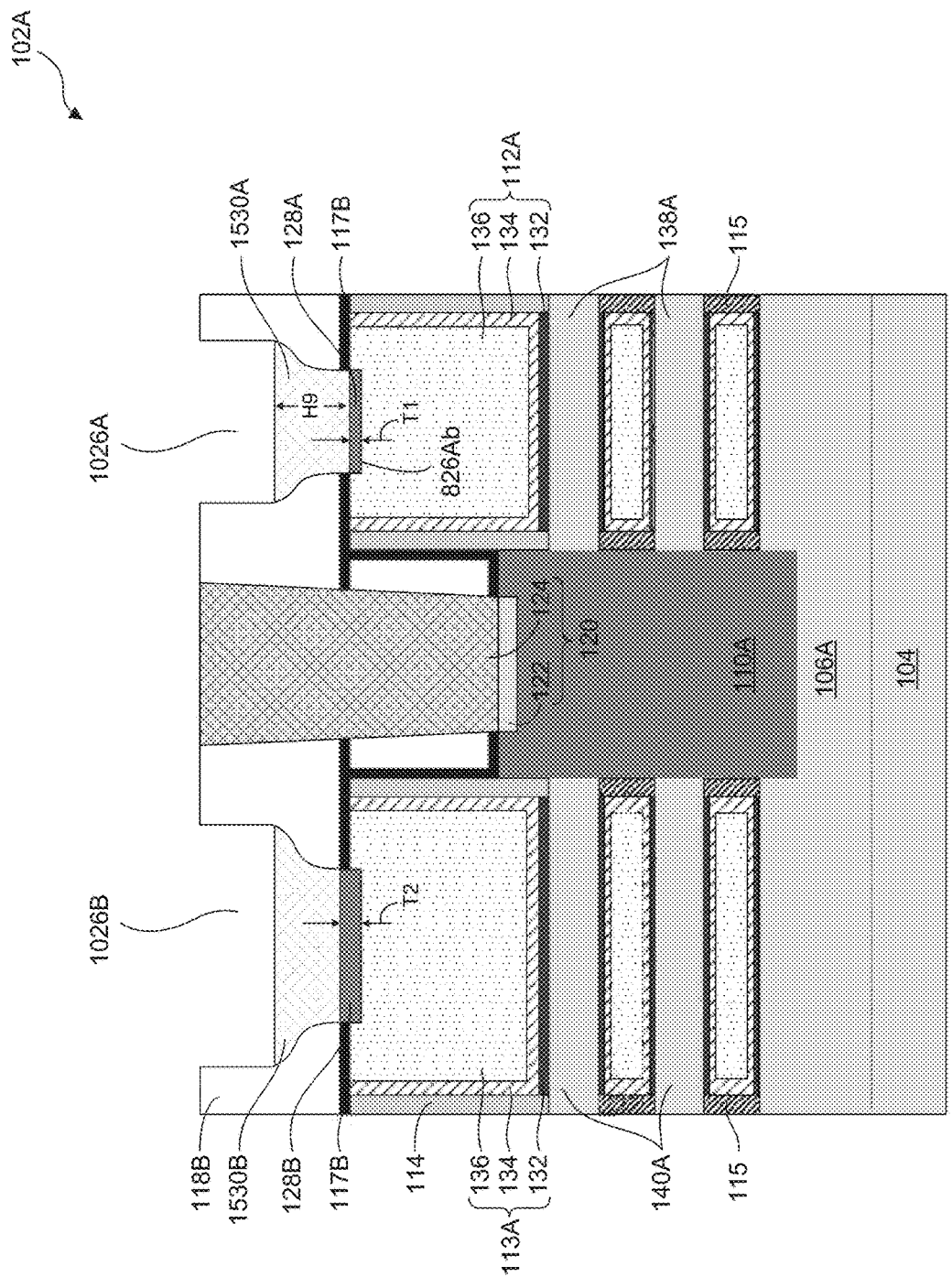
Figure 15B:
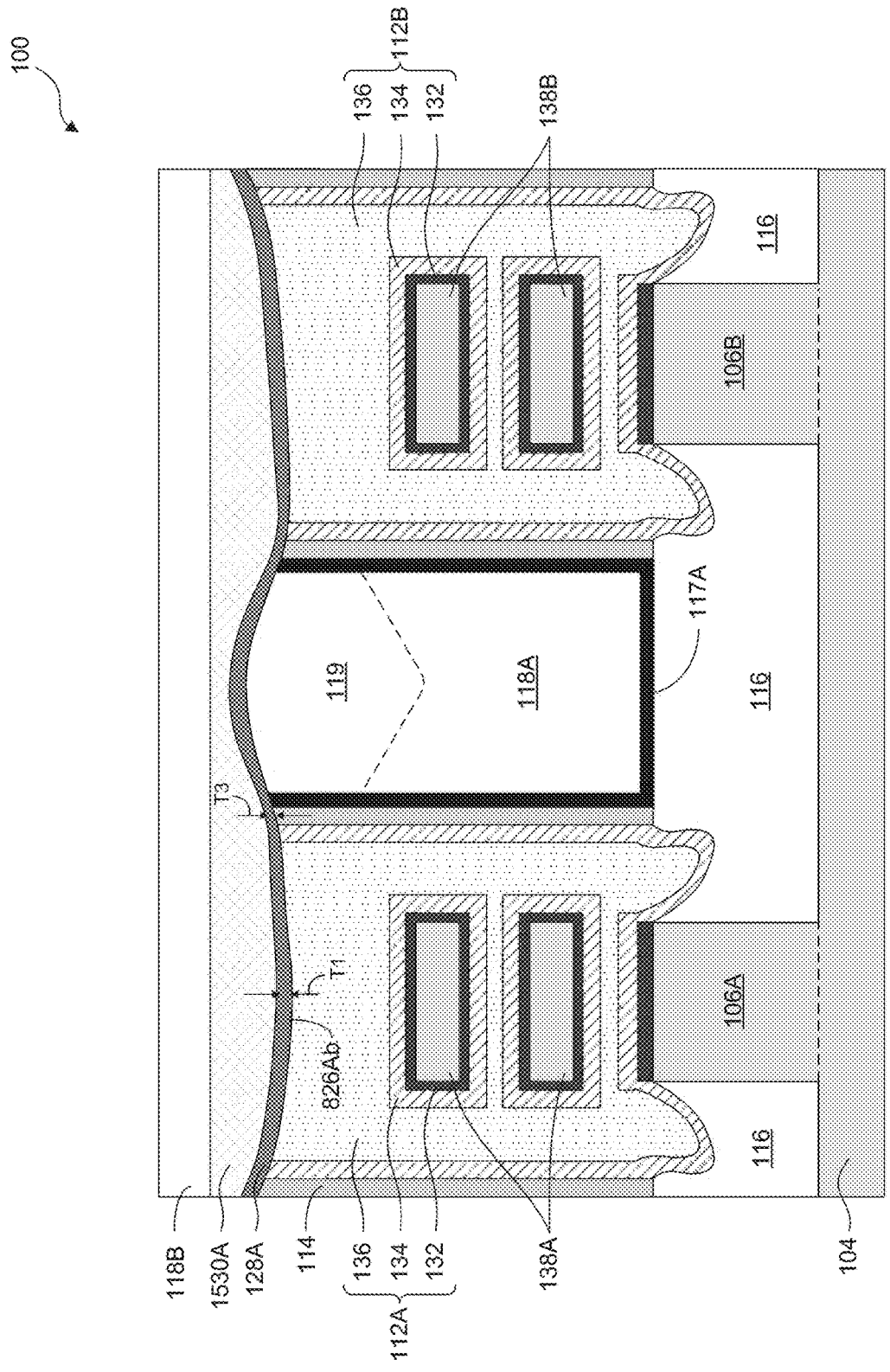
Figure 16A:
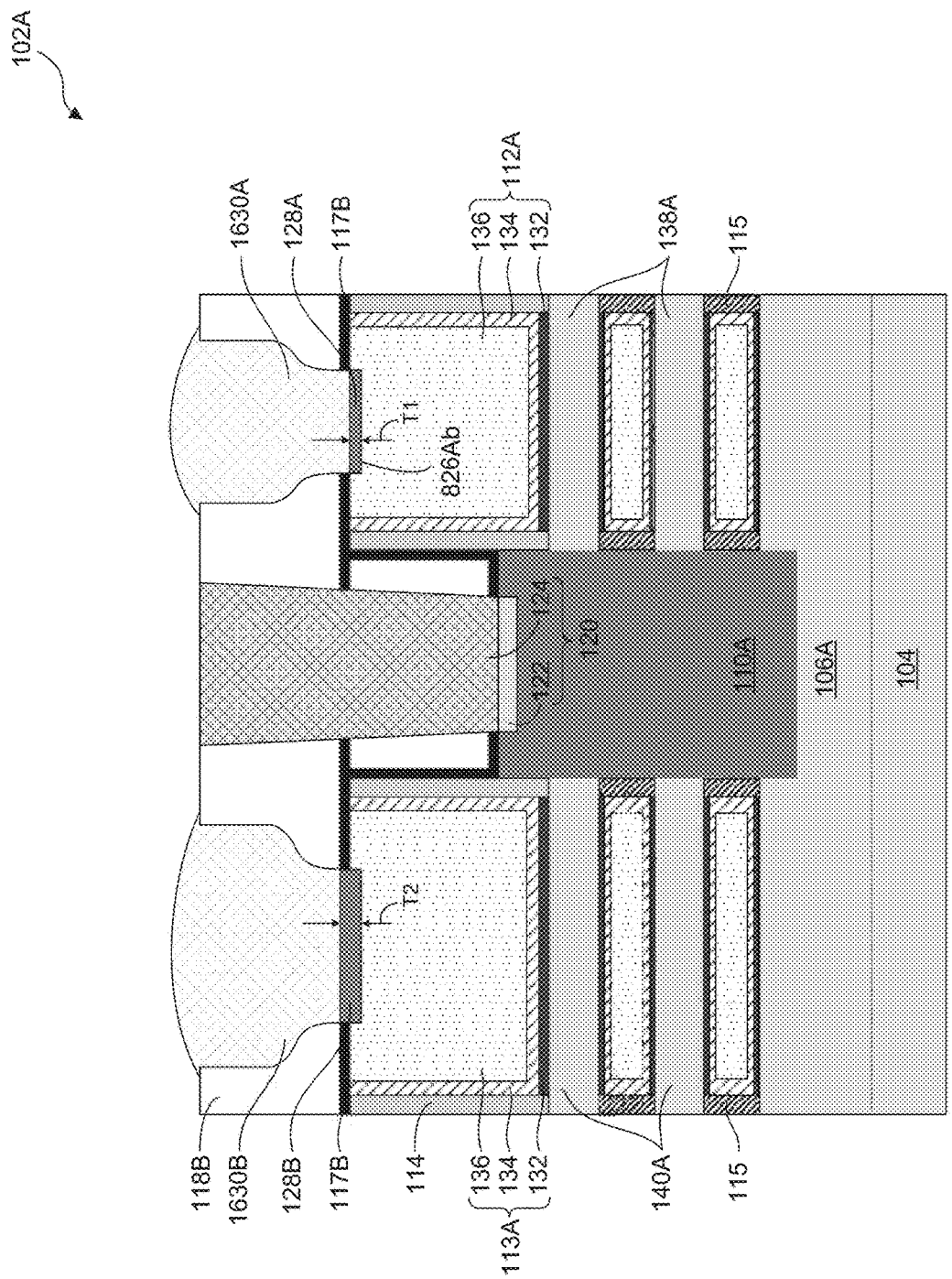
Figure 16B:
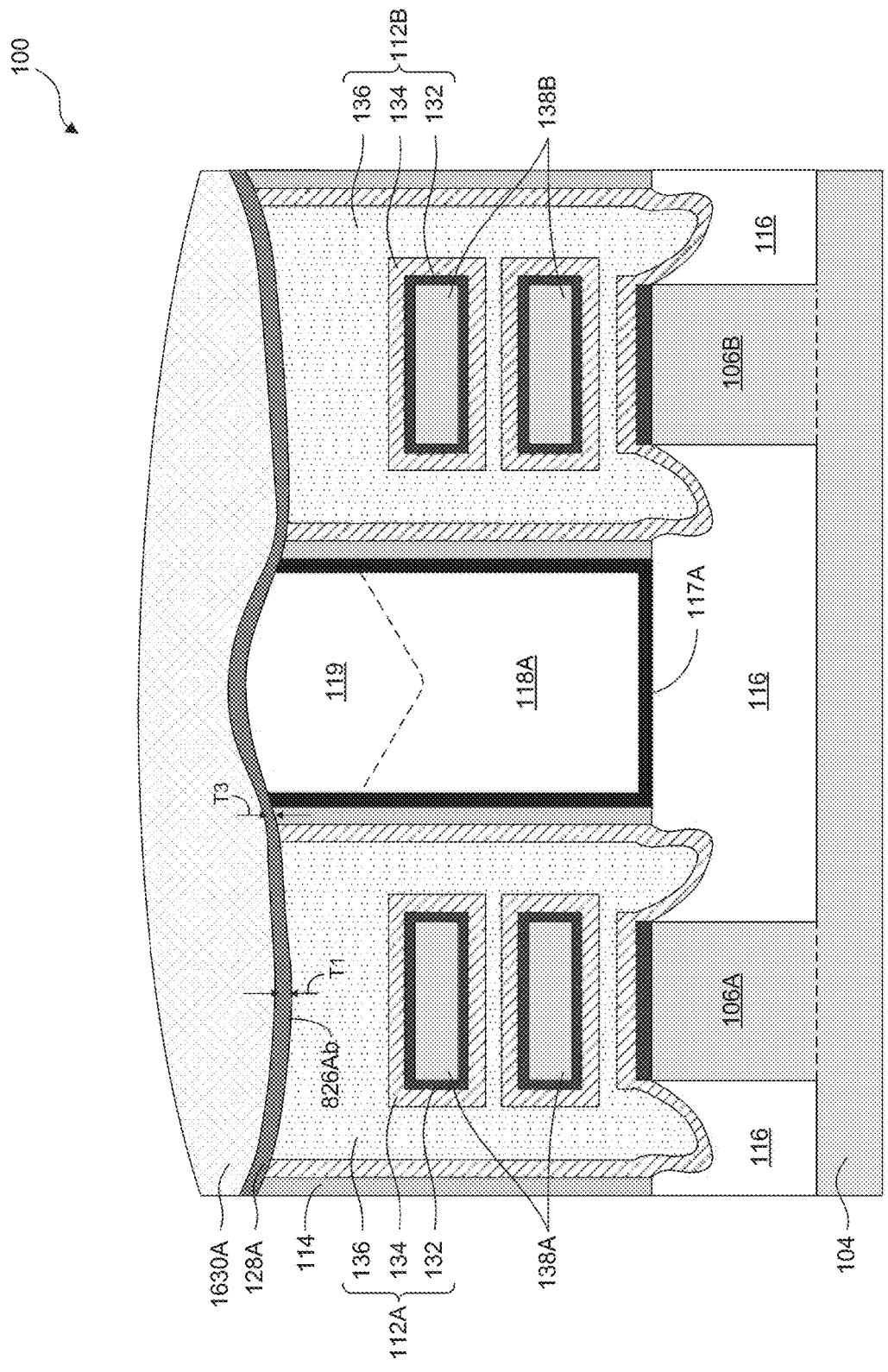
Figure 17A:
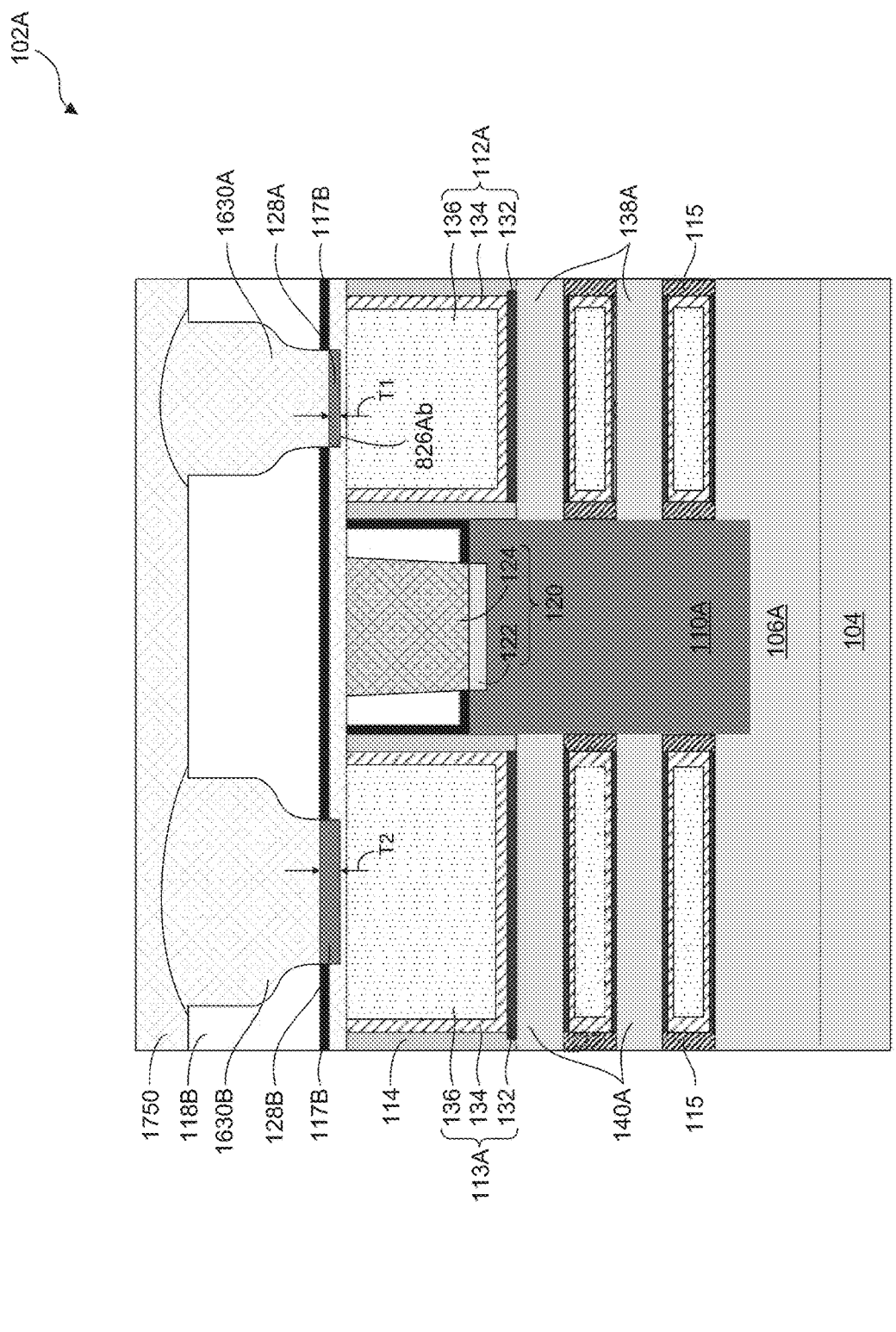
Figure 17B:
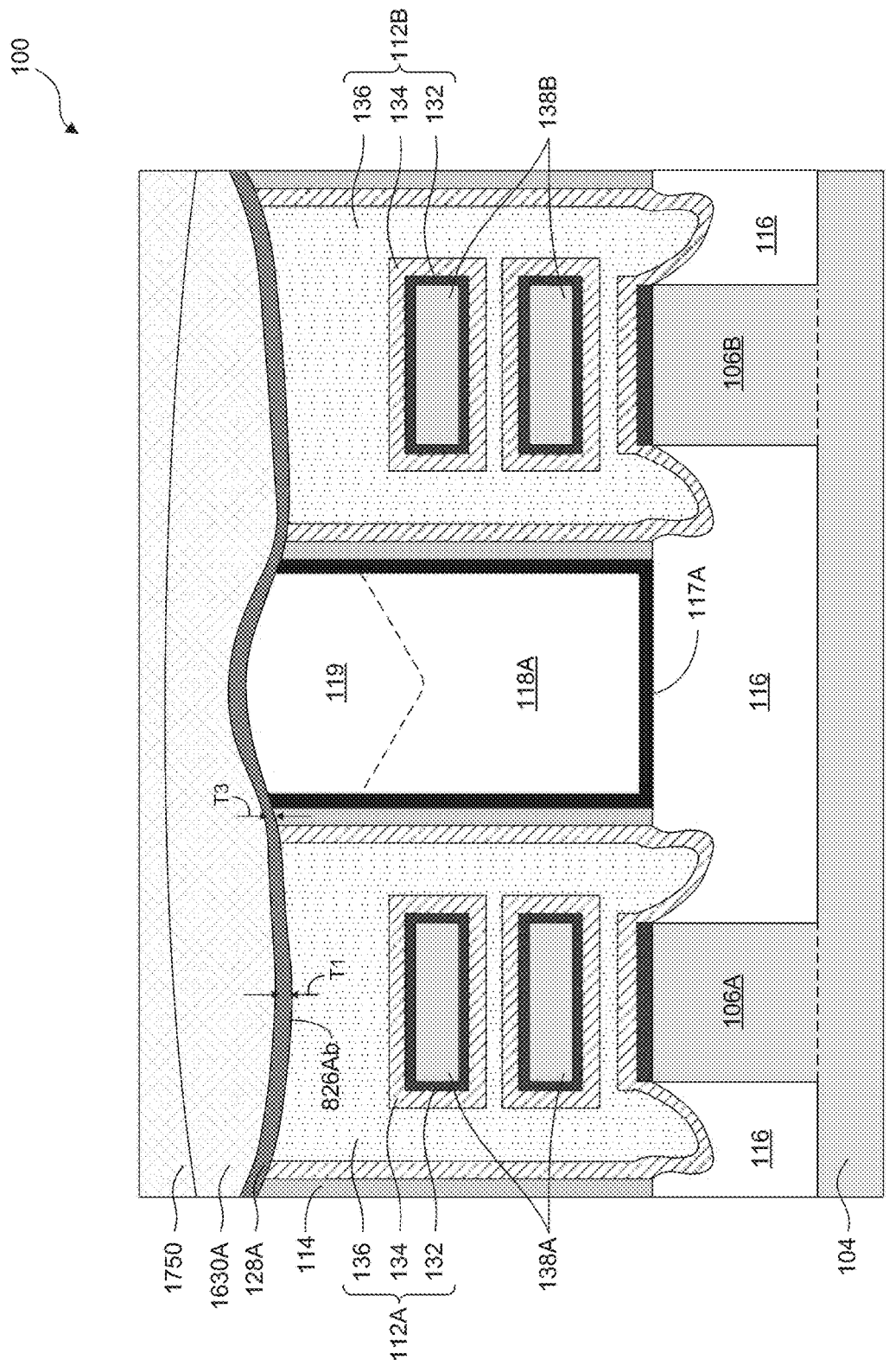
Figure 18A:
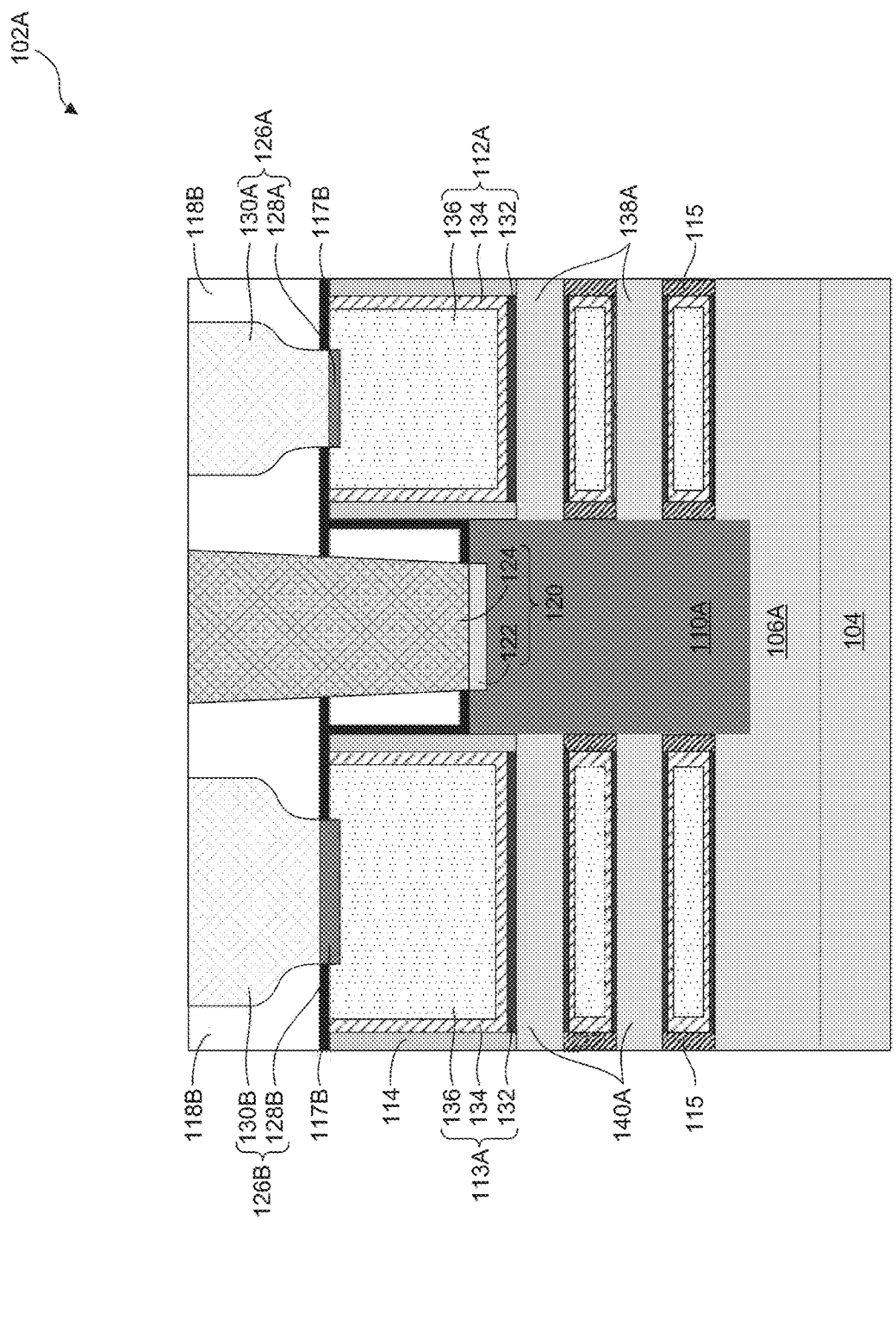
Figure 18B:
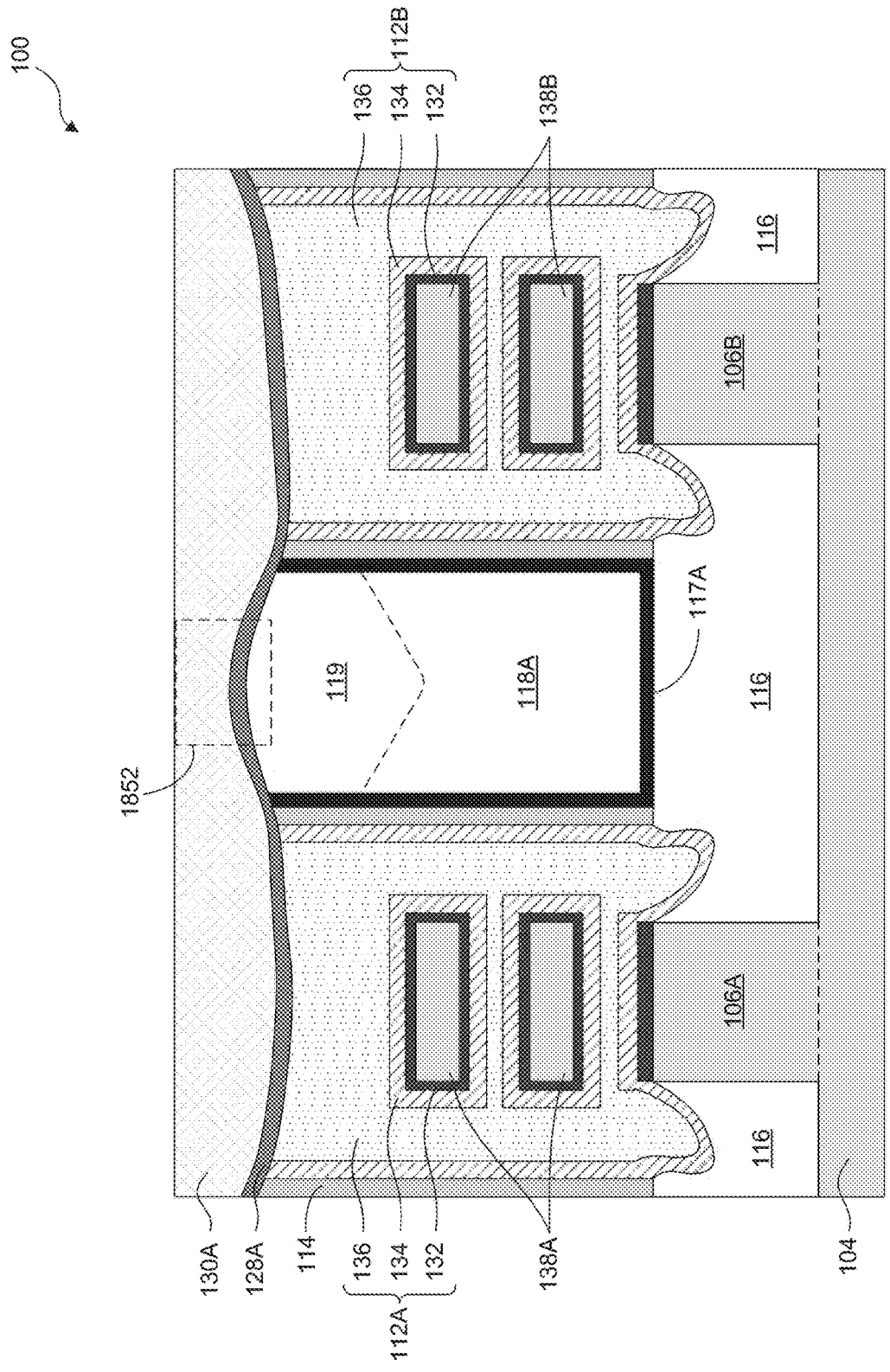

Referring to FIG. 2, in operation 230, conductive layers are formed on the seed layers by a bottom-up deposition process to fill the trench openings. For example, as described with reference to FIGS. 14A-18B, conductive layers 130A-130B can be formed on seed layers 128A-128B in trench openings 1026A-1026B. The formation of conductive layers 130A-130B can include sequential operations of (i) depositing conductive layers 1430A-1430B on seed layers 128A-128B to partially fill trench openings 1026A-1026B to a height H9 of about 10 nm to about 15 nm, as shown in FIGS. 14A-14B, (ii) removing portions of conductive layers 1430A-1430B along sidewalls of trench openings 1026A-1026B to form the structures of FIGS. 15A-15B, (iii) depositing conductive layers 1630A-1630B on conductive layers 1530A-1530B to fill trench openings 1026A-1026B, as shown in FIGS. 16A-16B, (iv) depositing a conductive layer 1750 on the structures of FIGS. 16A-16B to form the structures of FIGS. 17A-17B, (v) performing a chemical mechanical polishing (CMP) process on the structures of FIGS. 17A-17B to form the structures of FIGS. 18A-18B.

In some embodiments, the deposition of conductive layers 1430A-1430B and 1630A-1630B can be performed using an atomic layer deposition (ALD) process with metal precursors, such as metal halides, that have a higher deposition selectivity for the conductive material of seed layers 128A-128B than the insulating material of ILD layer 118B along the sidewalls of trench openings 1026A-1026B. In some embodiments, conductive layers 1430A-1430B and 1630A-1630B can have materials similar to or different from each other.

In some embodiments, after the formation of conductive layers 130A-130B, a region 1852 (shown in FIG. 18B) can be etched and replaced with isolation structure 131, as shown in FIG. 1E.

The present disclosure provides an example method for addressing challenges with forming a continuous liner-free contact structure (e.g., contact structures 126A-126B) across conductive structures (e.g., gate structures 112A-112B) separated by insulating structures (e.g., ILD layer 118A). The challenges can be due to the lower deposition selectivity of conductive materials for insulating surfaces than for conductive surfaces, which can prevent a substantially uniform deposition of the conductive materials across the conductive structures and the insulating structures. As a result of the non-uniform deposition of the conductive materials, a discontinuous liner-free contact structure and/or metal line can be formed across the conductive structures, which can degrade the electrical connection between the conductive structures.

In some embodiments, the example method (e.g., method 200) includes forming a liner-free contact structure extending along the top surfaces of gate structures of different FETs (e.g., FETs 102A-102B) and the top surfaces of insulating structures (e.g., ILD layer 118A) disposed between the gate structures. In some embodiments, the example method can further include a process to "cut" the liner-free contact structure into shorter sections to form individual contact structures on each of the gate structures. In other words, the process can remove portions (e.g., region 1852) of the liner-free contact structure between the gate structures to form one or more isolation structures (e.g., isolation structure 131) that can electrically isolate the remaining portions of the liner-free contact structure from each other. This method of forming individual contact structures by cutting a long contact structure can reduce the fabrication process complexities of forming contact structures with smaller dimensions. Moreover, this method can reduce structural and/or compositional non-uniformities among contact structures of different FETs of a semiconductor device, and consequently improve device performance.

In some embodiments, a method includes forming first and second source/drain (S/D) regions on first and second fin structures, respectively, forming a first dielectric layer between the first and second S/D regions, forming first and second gate-all-around (GAA) structures on the first and second fin structures, respectively, forming a second dielectric layer on the first and second GAA structures and the first dielectric layer, forming a tapered trench opening in the second dielectric layer and on the first and second GAA structures and the first dielectric layer, selectively forming a seed layer on top surfaces of the first and second GAA structures and the first dielectric layer that are exposed in the tapered trench opening, and selectively depositing a conductive layer on the seed layer to fill the tapered trench opening. The first and second GAA structures are electrically isolated by the first dielectric layer.

In some embodiments, a method includes forming first and second source/drain (S/D) regions on first and second fin structures, respectively, forming a first dielectric layer between the first and second S/D regions, forming first and second gate structures on the first and second fin structures, respectively, forming a second dielectric layer on the first and second gate structures and the first dielectric layer, forming a liner-free contact structure with a seed layer and a conductive layer in the second dielectric layer and on the first and second gate structures and the first dielectric layer, and forming an isolation structure in the liner-free contact structure. The first and second gate structures are electrically isolated by the first dielectric layer.

In some embodiments, a semiconductor device includes a substrate, first and second source/drain (S/D) regions disposed on first and second fin structures, respectively, a first dielectric layer disposed between the first and second S/D regions, first and second gate structures disposed on the first and second fin structures, respectively, a second dielectric layer disposed on the first and second gate structures and the first dielectric layer, a liner-free contact structure with a seed layer and a conductive layer in the second dielectric layer and on the first and second gate structures and the first dielectric layer, and an isolation structure disposed in the liner-free contact structure. The first and second gate structures are electrically isolated by the first dielectric layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming first and second nanostructured layers on a substrate;
   forming a first dielectric layer between the first and second nanostructured layers;
   forming a first gate-all-around (GAA) structure surrounding the first nanostructured layer;
   forming a second GAA structure surrounding the second nanostructured layer, wherein the first and second GAA structures are electrically isolated by the first dielectric layer;
   forming a second dielectric layer on the first and second GAA structures and the first dielectric layer;
   forming a tapered trench opening in the second dielectric layer and on top horizontal surfaces of the first and second GAA structures and the first dielectric layer;
   selectively forming a seed layer on the top horizontal surfaces of the first and second GAA structures and the first dielectric layer that are exposed in the tapered trench opening; and
   selectively depositing a conductive layer on the seed layer to fill the tapered trench opening.

2. The method of claim 1, wherein forming the tapered trench opening comprises forming a trench opening with top and bottom portions having substantially vertical sidewalls and a transition portion having sloped sidewalls, wherein the top portion is wider than the bottom portion.

3. The method of claim 1, wherein forming the tapered trench opening comprises:
   forming a trench opening with a first width in the second dielectric layer;
   depositing a masking layer in a bottom portion of the trench opening with the first width to partially fill the trench opening; and performing a lateral etch on portions of the second dielectric layer exposed in a top portion of the trench opening above the masking layer to form a second width of the top portion that is greater than the first width of the bottom portion.

4. The method of claim 1, wherein selectively forming the seed layer comprises:
depositing a seed layer material in the tapered trench opening, wherein a first portion of the seed layer material is deposited along sidewalls of the tapered trench opening and a second portion of the seed layer material is deposited on the first and second GAA structures and the first dielectric layer; and
selectively etching the first portion of the seed layer material.

5. The method of claim 1, wherein selectively forming the seed layer comprises:
depositing a seed layer material in the tapered trench opening and on the second dielectric layer;
selectively etching first portions of the seed layer material along sidewalls of the tapered trench opening;
filling the tapered trench opening with a masking layer; and
etching second portions of the seed layer material on the second dielectric layer.

6. The method of claim 1, wherein selectively depositing the conductive layer comprises:
depositing a first conductive layer on the seed layer using a first deposition process with a precursor having a metal halide;
etching portions of the first conductive layer along sidewalls of the tapered trench opening; and
depositing a second conductive layer on the first conductive layer using the first deposition process.

7. The method of claim 1, wherein forming the tapered trench opening comprises forming a trench opening with a bottom portion having a first width and a top portion having a second width, wherein a ratio between the first and second widths ranges from about 1:1.5 to about 1:3.

8. The method of claim 1, wherein forming the tapered trench opening comprises forming a trench opening with a bottom portion having a first height and a top portion having a second height, wherein a ratio between the first and second heights ranges from about 1:1 to about 1:2.

9. The method of claim 1, wherein forming the tapered trench opening comprises forming a trench opening with an aspect ratio that ranges from about 5:1 to about 10:1.

10. The method of claim 1, wherein forming the tapered trench opening comprises forming a trench opening with a bottom portion having a first width and a top portion having a second width, wherein a ratio between the first width and a gate length of the first GAA structure ranges from 1:3 to about 1:6, and wherein a ratio between the second width and the gate length of the first GAA structure ranges from 1:1.5 to about 1:3.

11. A method, comprising:
forming first and second source/drain (S/D) regions on a substrate;
forming a first dielectric layer between the first and second S/D regions;
forming first and second gate structures on the substrate, wherein the first and second gate structures are electrically isolated by the first dielectric layer;
forming a second dielectric layer on the first and second gate structures and the first dielectric layer; and
forming a contact structure comprising a seed layer and a conductive layer in the second dielectric layer and on top surfaces of the first and second gate structures and the first dielectric layer.

12. The method of claim 11, wherein forming the contact structure comprises:
forming a tapered trench opening in the second dielectric layer and on the first and second gate structures and the first dielectric layer;
selectively forming the seed layer on the top surfaces of the first and second gate structures and the first dielectric layer that are exposed in the tapered trench opening; and
selectively depositing the conductive layer on the seed layer to fill the tapered trench opening.

13. The method of claim 11, wherein forming the contact structure comprises:
forming a tapered trench opening in the second dielectric layer and on the first and second gate structures and the first dielectric layer;
depositing a seed layer material in the tapered trench opening with a first portion along sidewalls of the tapered trench opening and a second portion on the first and second gate structures and the first dielectric layer; and
selectively etching the first portion of the seed layer material.

14. The method of claim 11, wherein forming the contact structure comprises:
forming a tapered trench opening in the second dielectric layer and on the first and second gate structures and the first dielectric layer;
selectively forming a seed layer on the top surfaces of the first and second gate structures and the first dielectric layer that are exposed in the tapered trench opening;
depositing a first conductive layer on the seed layer using a first deposition process with a precursor having a metal halide;
etching portions of the first conductive layer along sidewalls of the tapered trench opening; and
depositing a second conductive layer on the first conductive layer using the first deposition process.

15. The method of claim 11, wherein forming the contact structure comprises forming a trench opening with top and bottom portions having substantially vertical sidewalls and a transition portion having sloped sidewalls, wherein the top portion is wider than the bottom portion.

16. The method of claim 11, further comprising forming, in the first dielectric layer, an isolation structure comprising a material with a density higher than a density of a material of the first dielectric layer.

17. A method, comprising:
forming a gate structure on a substrate;
depositing a dielectric layer on the gate structure;
forming, in the dielectric layer and through a top surface of the gate structure, a trench with a top portion comprising a first width and a bottom portion comprising a second width substantially equal to the first width;
modifying the first width of the top portion to a third width that is greater than the second width;
forming a seed layer in the bottom portion of the trench; and
forming a conductive layer on the seed layer.

18. The method of claim 17, wherein modifying the first width of the top portion comprises etching portions of the dielectric layer surrounding the top portion of the trench.

19. The method of claim 17, wherein forming the conductive layer comprises:
- depositing a first conductive layer to partially fill the bottom portion of the trench;
- etching portions of the first conductive layer from sidewalls of the top portion of the trench; and
- depositing a second conductive layer to fill the top portion of the trench.

20. The method of claim 17, wherein forming the seed layer comprises:
- depositing a metal layer in the trench; and
- etching portions of the metal layer from sidewalls of the trench.

* * * * *